(12) United States Patent
Wang et al.

(10) Patent No.: US 10,505,045 B2
(45) Date of Patent: Dec. 10, 2019

(54) FIN FIELD EFFECT TRANSISTOR (FINFET) DEVICE STRUCTURE WITH CONDUCTIVE LAYER BETWEEN GATE AND GATE CONTACT

(71) Applicant: Taiwan Semiconductor Manufacturing Co., Ltd., Hsinchu (TW)

(72) Inventors: Chao-Hsun Wang, Taoyuan (TW); Kuo-Yi Chao, Hsinchu (TW); Rueijer Lin, Hsinchu (TW); Chen-Yuan Kao, Zhudong Township, Hsinchu County (TW); Mei-Yun Wang, Chupei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/821,994

(22) Filed: Nov. 24, 2017

(65) Prior Publication Data

US 2019/0165176 A1    May 30, 2019

(51) Int. Cl.
| | |
|---|---|
| *H01L 27/088* | (2006.01) |
| *H01L 29/78* | (2006.01) |
| *H01L 21/768* | (2006.01) |
| *H01L 29/66* | (2006.01) |
| *H01L 23/535* | (2006.01) |
| *H01L 29/417* | (2006.01) |
| *H01L 29/45* | (2006.01) |

(52) U.S. Cl.
CPC .... *H01L 29/7851* (2013.01); *H01L 21/76897* (2013.01); *H01L 23/535* (2013.01); *H01L 29/41791* (2013.01); *H01L 29/456* (2013.01); *H01L 29/66545* (2013.01); *H01L 29/66795* (2013.01); *H01L 29/785* (2013.01)

(58) Field of Classification Search
CPC ............ H01L 21/76897; H01L 23/535; H01L 29/66795
USPC .................................................. 257/401, 407
See application file for complete search history.

(56) References Cited

U.S. PATENT DOCUMENTS

| | | | |
|---|---|---|---|
| 9,812,329 B2* | 11/2017 | Chung | H01L 21/28518 |
| 2007/0099414 A1* | 5/2007 | Frohberg | H01L 21/76877 |
| | | | 438/618 |
| 2013/0078800 A1* | 3/2013 | Lai | H01L 21/28052 |
| | | | 438/653 |
| 2016/0293721 A1* | 10/2016 | Chuang | H01L 21/28088 |

* cited by examiner

*Primary Examiner* — Tan N Tran
(74) *Attorney, Agent, or Firm* — Birch, Stewart, Kolasch & Birch, LLP

(57) ABSTRACT

A FinFET device structure is provided. The FinFET device structure includes a fin structure formed over a substrate and a gate dielectric layer formed over the fin structure. The FinFET device structure includes a gate electrode layer formed over the gate dielectric later and a gate contact structure formed over the gate electrode layer. The gate contact structure includes a first conductive layer formed over the gate electrode layer, a barrier layer formed over the first conductive layer and a second conductive layer over the barrier layer. The second conductive layer is electrically connected to the gate electrode layer by the first conductive layer.

20 Claims, 47 Drawing Sheets

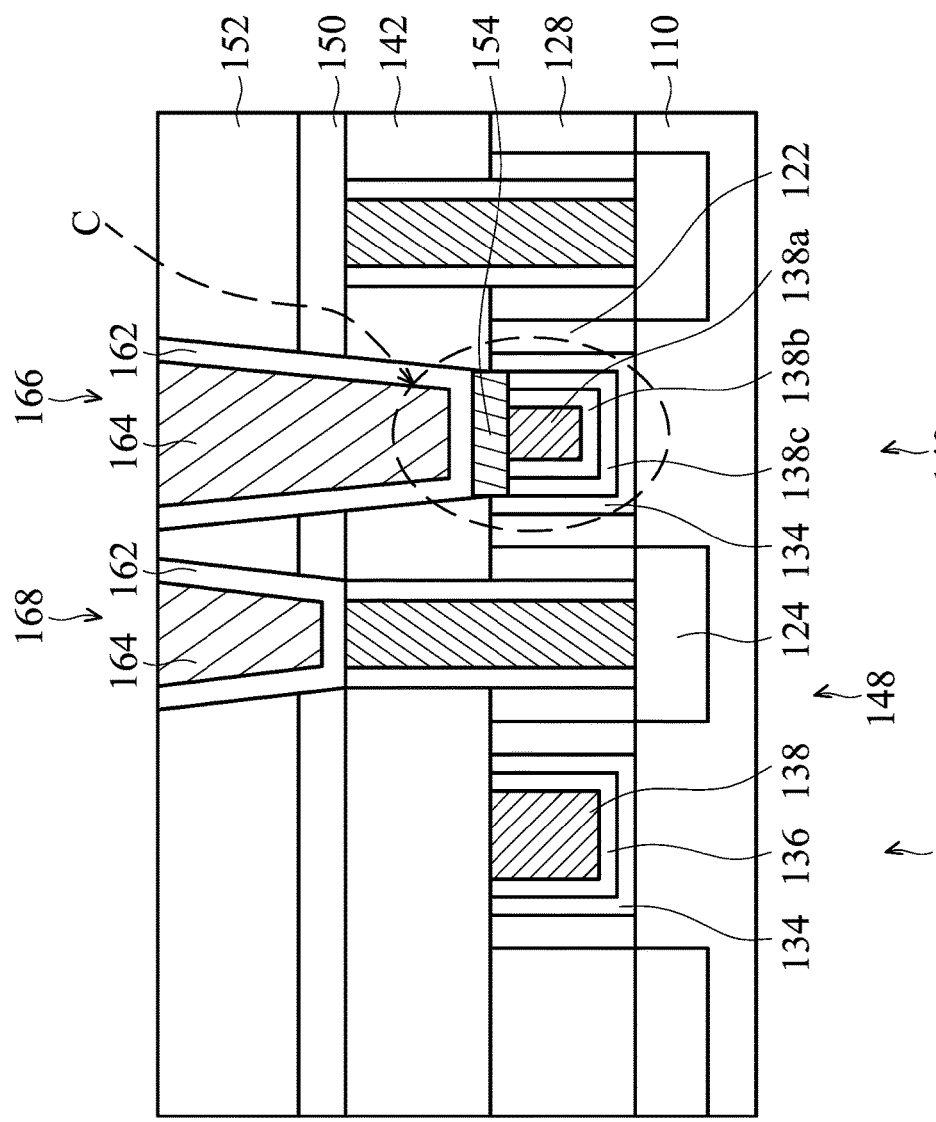
FIG. 2E"

FIN FIELD EFFECT TRANSISTOR (FINFET) DEVICE STRUCTURE WITH CONDUCTIVE LAYER BETWEEN GATE AND GATE CONTACT

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2E' shows a cross-sectional representation of a modified FinFET device structure, in accordance with some embodiments of the disclosure.

FIG. 2E" shows a cross-sectional representation of a modified FinFET device structure, in accordance with some embodiments of the disclosure.

FIG. 5H' shows a cross-sectional representation of a modified FinFET device structure, in accordance with some embodiments of the disclosure.

FIG. 7G' shows a cross-sectional representation of a modified FinFET device structure, in accordance with some embodiments of the disclosure.

DETAILED DESCRIPTION

Figure 1A:
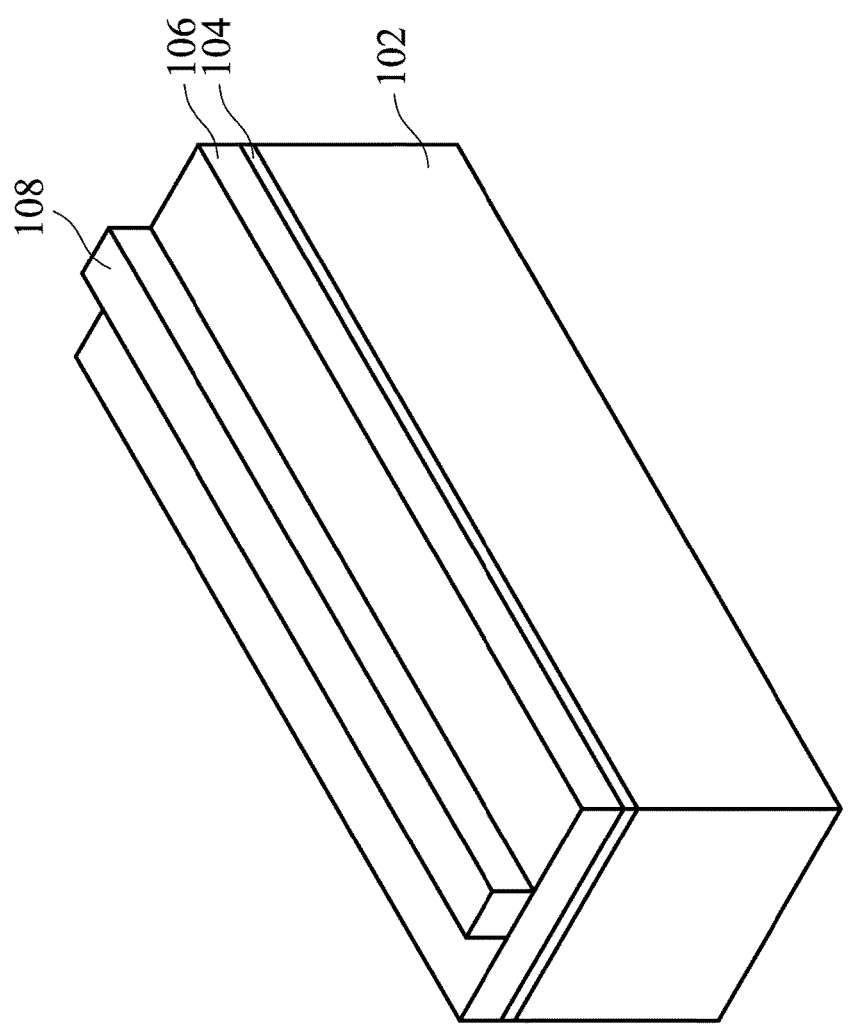
FIGS. 1A-1N show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1N show perspective representations of various stages of forming a FinFET device structure 100a, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
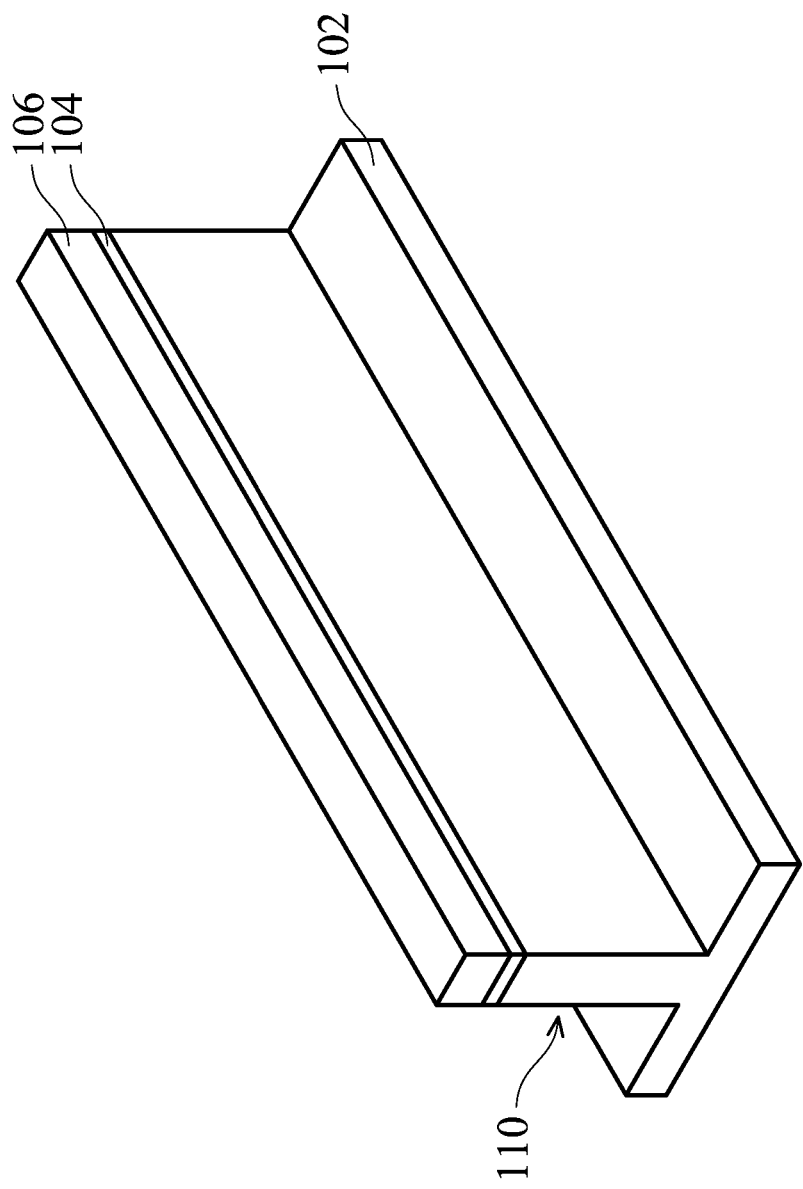

As shown in FIG. 1B, after the photoresist layer 108 is patterned, the dielectric layer 104 and the mask layer 106 are patterned by using the patterned photoresist layer 108 as a mask, in accordance with some embodiments. As a result, a patterned pad layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
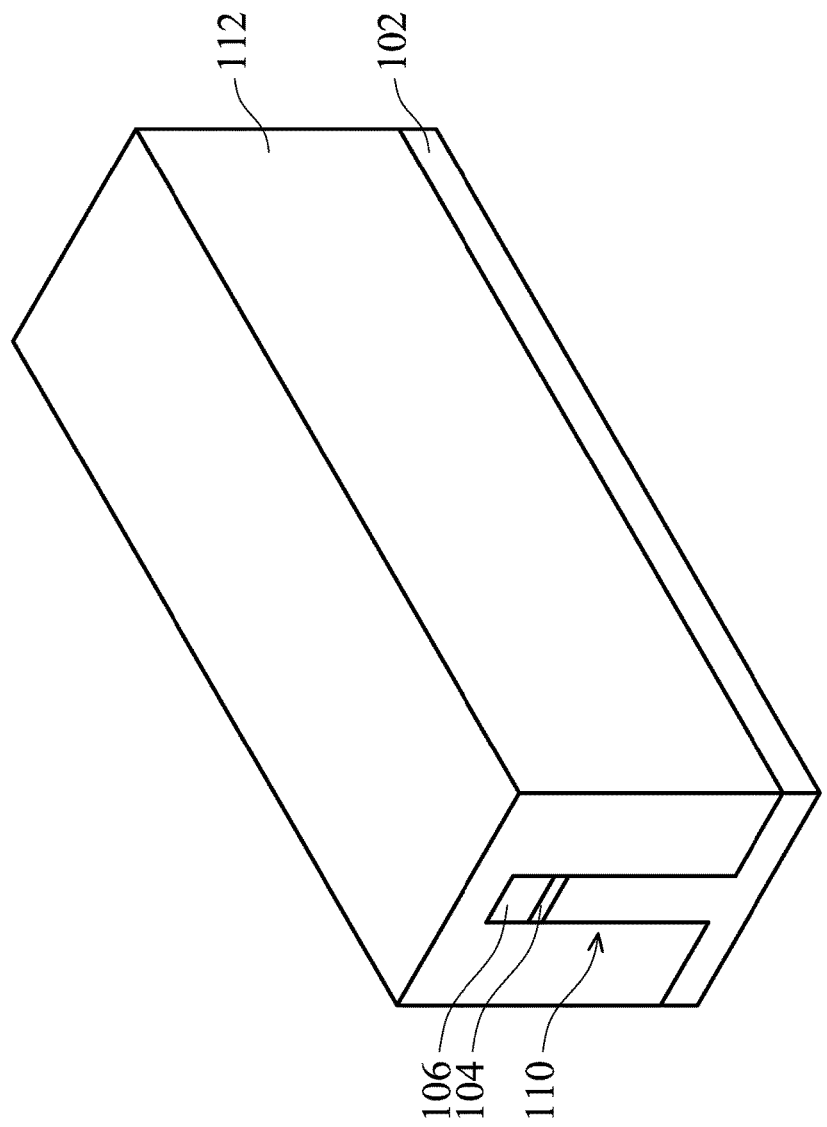

As shown in FIG. 1C, after the fin structure 110 is formed, an insulating layer 112 is formed to cover the fin structure 110 over the substrate 102, in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process. Afterwards, the patterned dielectric layer 104 and the patterned mask layer 106 are removed.

Figure 1D:
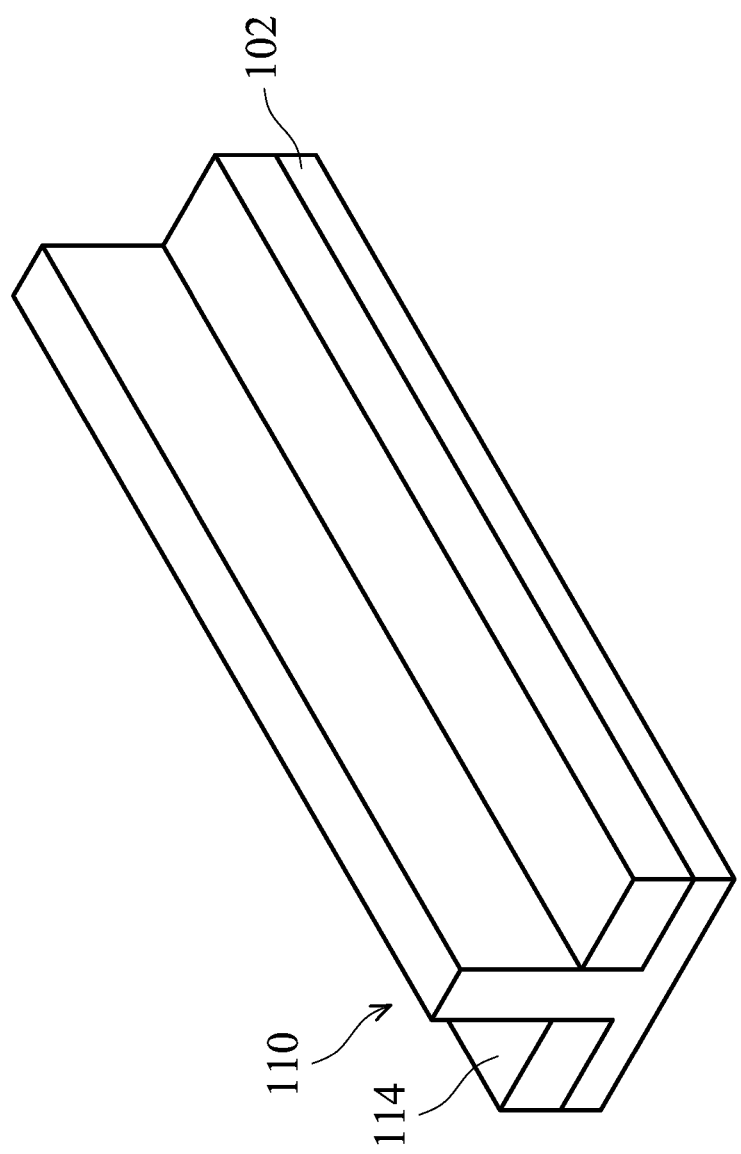

Afterwards, as shown in FIG. 1D, a portion of the insulating layer 112 is removed to form an isolation structure 114, in accordance with some embodiments. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference and crosstalk.

Figure 1E:
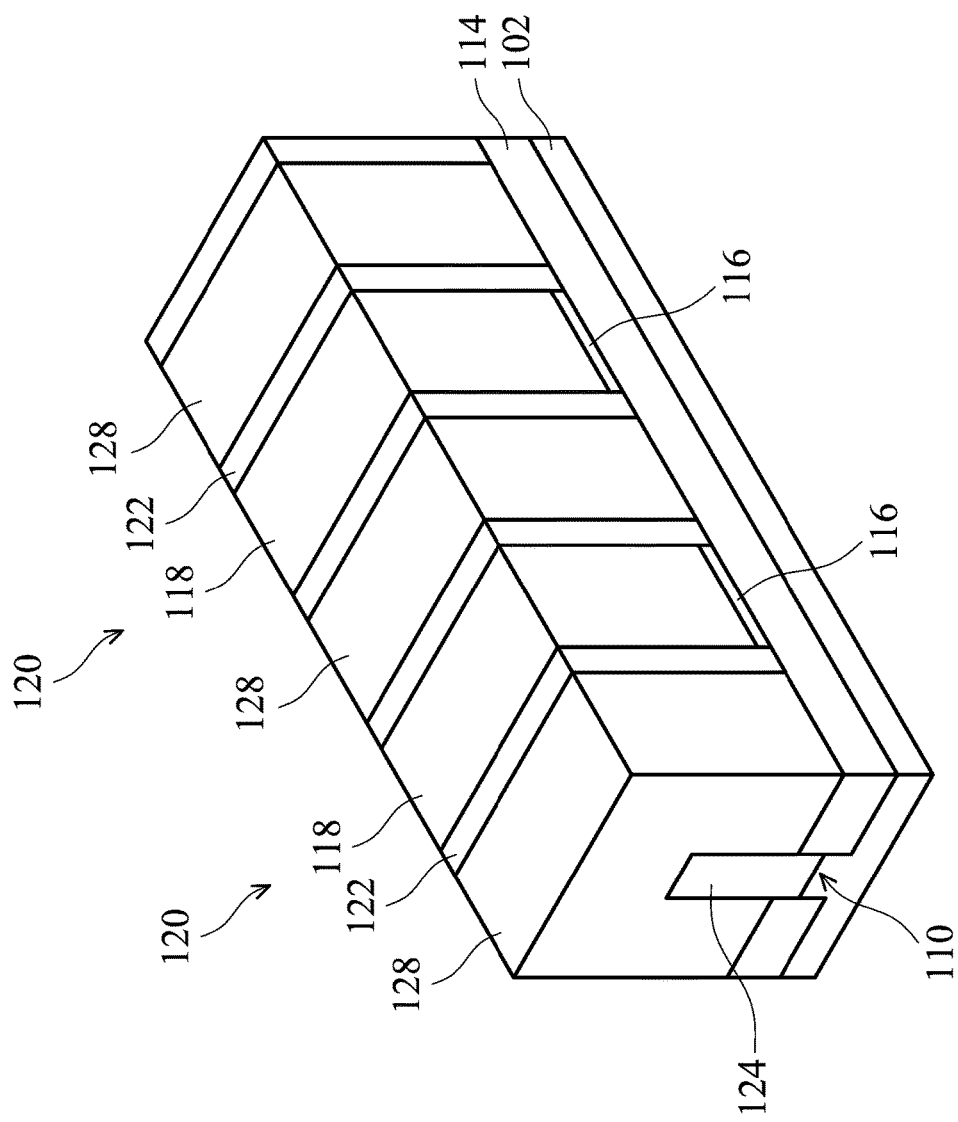

Afterwards, as shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. After the dummy gate structure 120 is formed, the gate spacer layers 122 are formed on opposite sidewall surfaces of the dummy gate structure 120. The gate spacer layers 122 may be a single layer or multiple layers.

In order to improve the speed of the FinFET device structure 100, the gate spacer layers 122 are made of low-k dielectric materials. In some embodiments, the low-k dielectric materials has a dielectric constant (k value) is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

Afterwards, source/drain (S/D) structures 124 are formed over the fin structure 110. In some embodiments, portions of the fin structure 110 adjacent to the dummy gate structure 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

After the source/drain (S/D) structures 124 are formed, a contact etch stop layer (CESL) (not shown) is formed over the substrate 102, and an inter-layer dielectric (ILD) structure 128 is formed over the contact etch stop layer 126. In some other embodiments, the CESL is made of silicon nitride, silicon oxynitride, and/or other applicable materials. The contact etch stop layer may be formed by plasma enhanced CVD, low-pressure CVD, ALD, or other applicable processes.

The ILD structure 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 128 may be formed by chemical vapor deposition (CVD), physical vapor deposition, (PVD), atomic layer deposition (ALD), spin-on coating, or another applicable process.

Afterwards, a polishing process is performed on the ILD structure 128 until the top surface of the dummy gate structure 120 is exposed. In some embodiments, the ILD structure 128 is planarized by a chemical mechanical polishing (CMP) process.

Figure 1F:
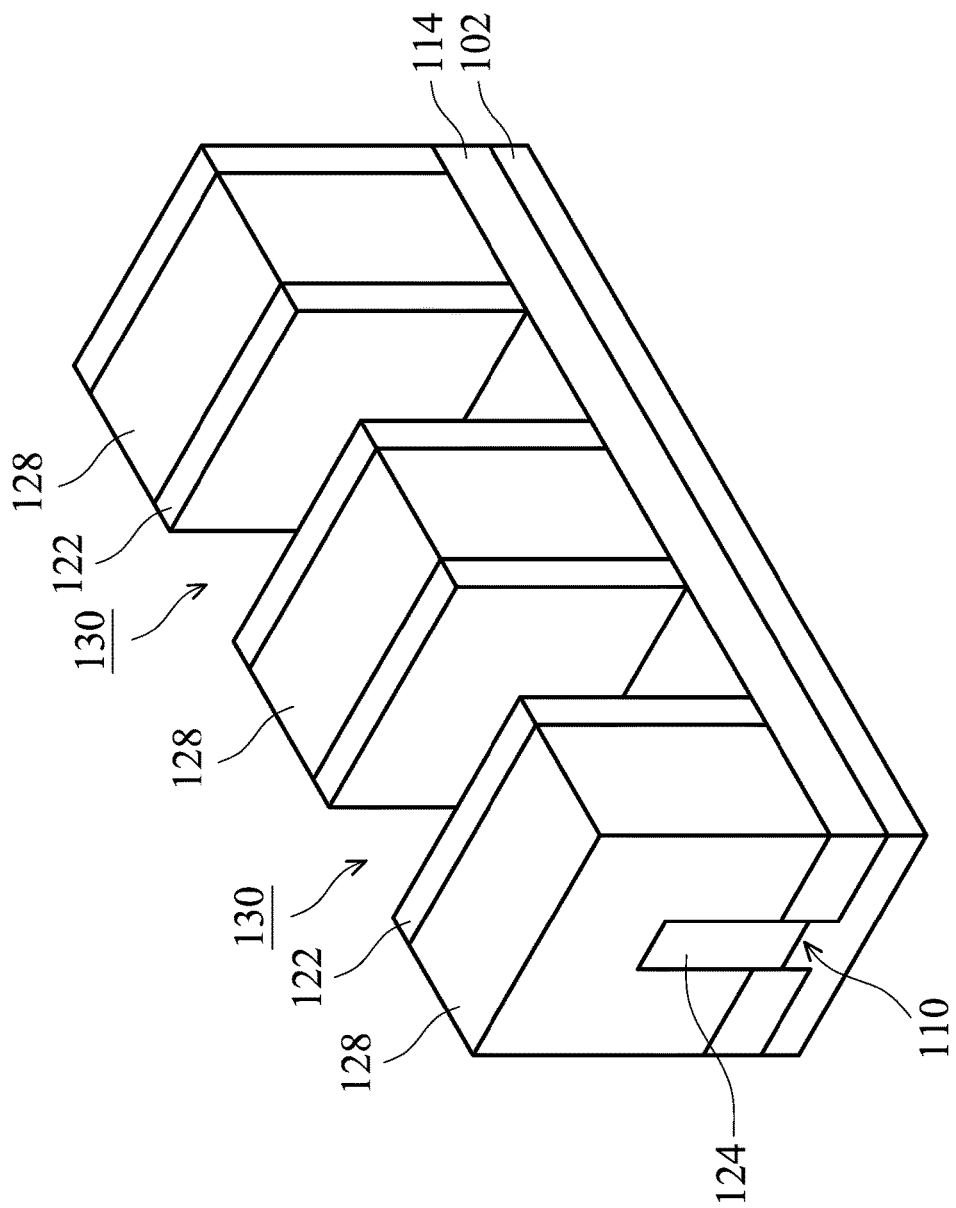

Afterwards, as shown in FIG. 1F, the dummy gate structure 120 is removed to form a trench 130 in the ILD structure 128, in accordance with some embodiments. The dummy gate dielectric layer 116 and the dummy gate electrode layer 118 are removed by an etching process, such as a dry etching process or a wet etching process.

Figure 1G:
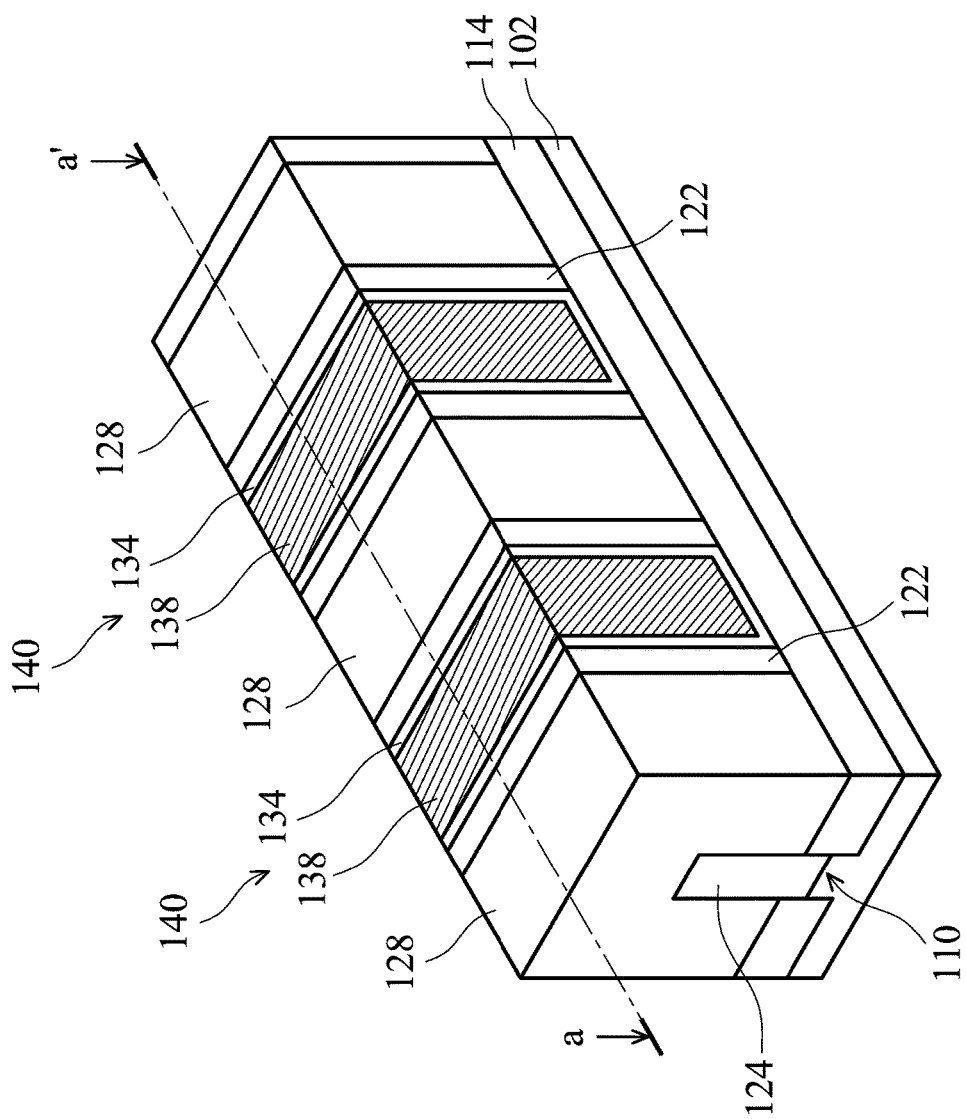

Next, as shown in FIG. 1G, a gate structure 140 is formed in the trench 130, in accordance with some embodiments. The gate structure 140 includes a gate dielectric layer 134 and a gate electrode layer 138.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials. In some embodiments, the gate electrode layer 138 includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 1H:
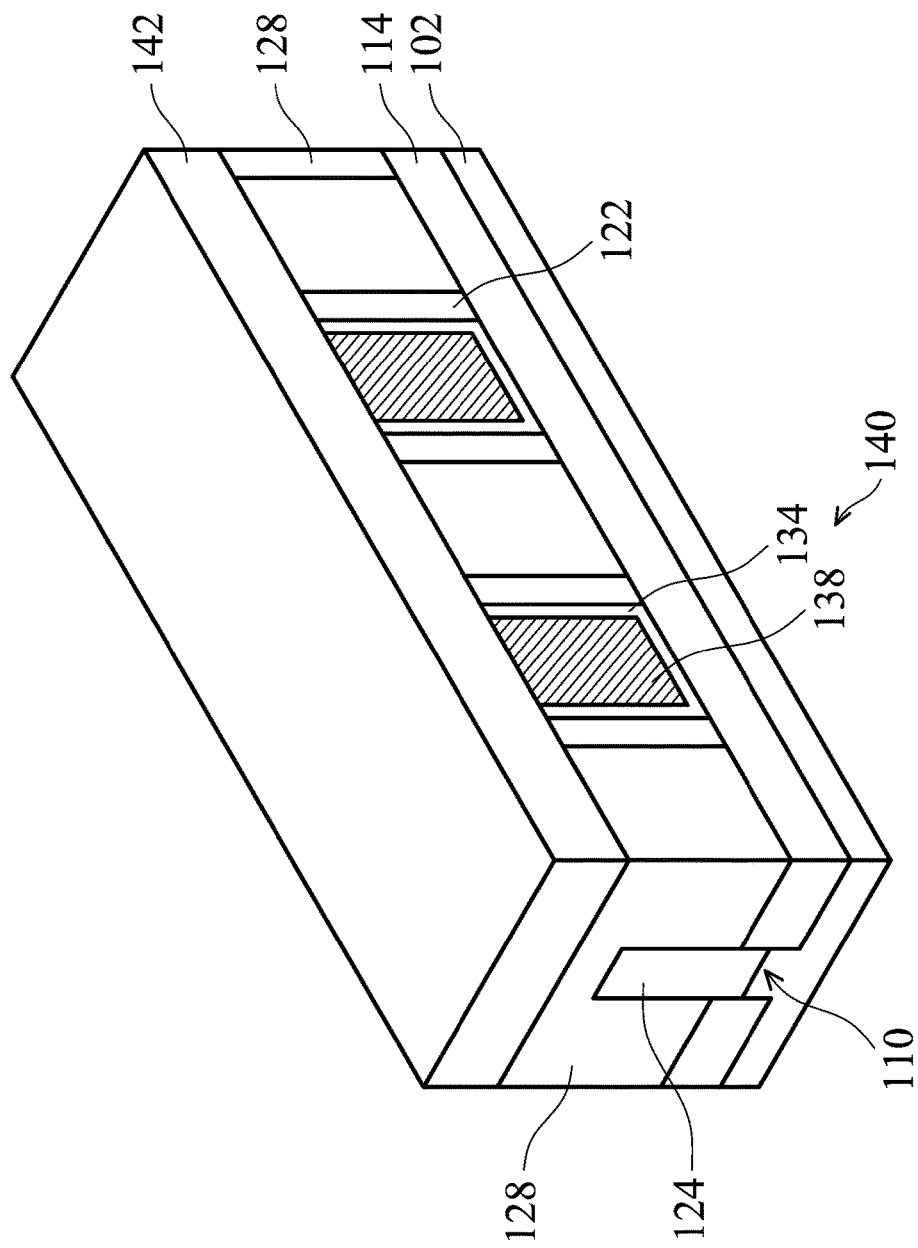

Next, as shown in FIG. 1H, a first dielectric layer 142 is formed over the gate structure 140 and over the ILD structure 128, in accordance with some embodiments.

The first dielectric layer 142 may be a single layer or multiple layers. The first dielectric layer 142 is made of silicon oxide (SiOx), silicon nitride (SixNy), silicon oxynitride (SiON), dielectric material(s) with low dielectric constant (low-k), or combinations thereof. In some embodiments, the first dielectric layer 142 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide (SiO$_2$). In some embodiments, the dielectric layer 142 is deposited by a plasma enhanced chemical vapor deposition (PECVD) process or by a spin coating process.

Figure 1I:
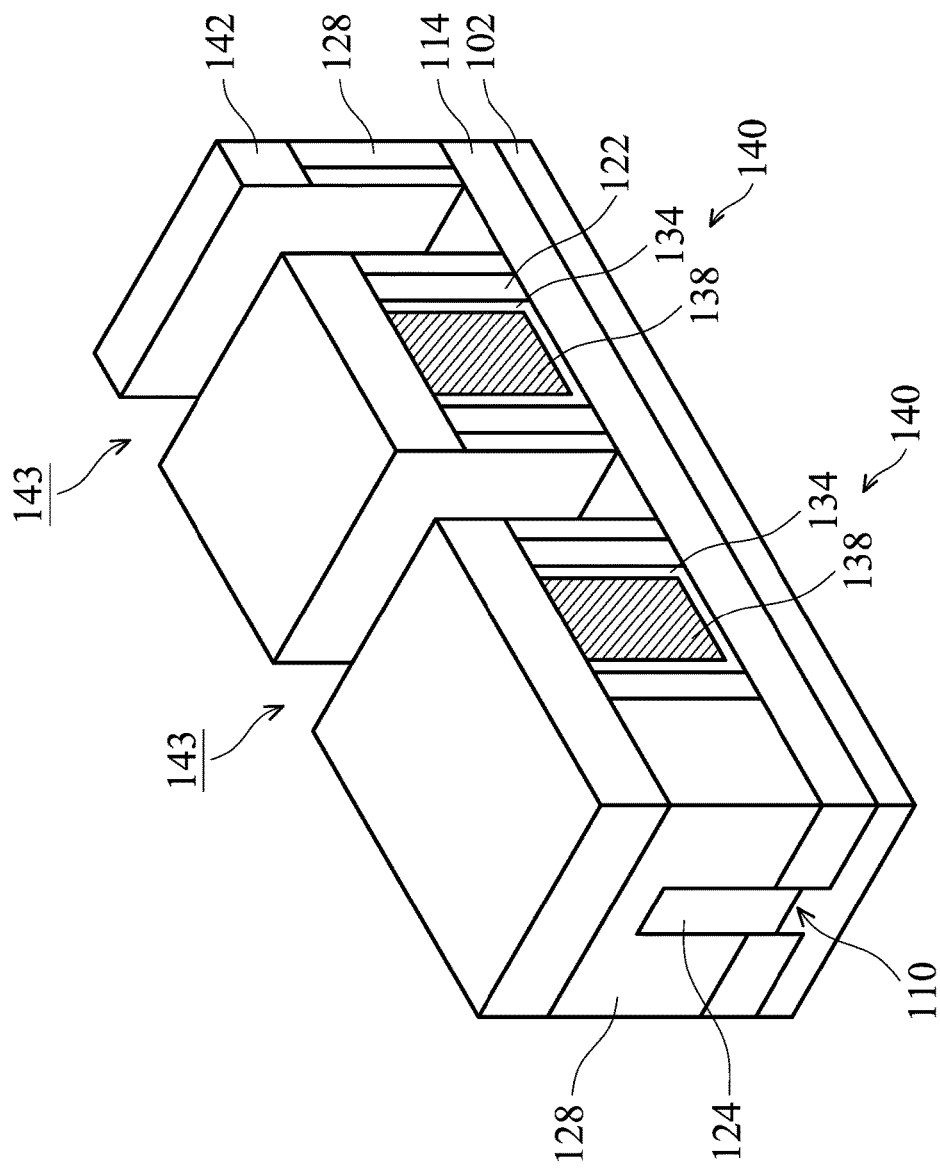

Afterwards, as shown in FIG. 1I, a portion of the first dielectric layer 142, a portion of the ILD structure 128 are removed to form a trench 143, in accordance with some embodiments. As a result, the S/D structure 124 is exposed by the trench 143.

Figure 1J:
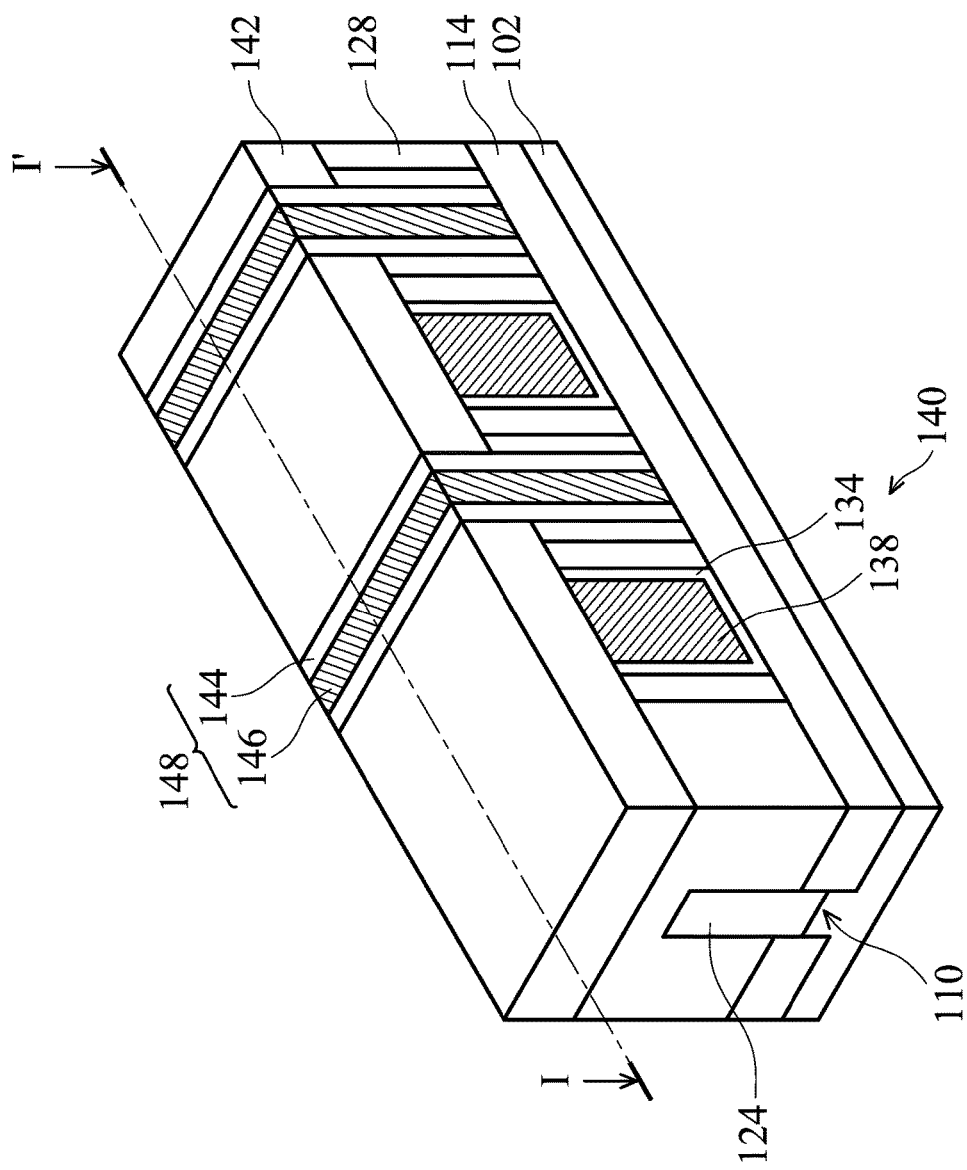

Subsequently, as shown in FIG. 1J, a glue layer 144 is formed in the sidewall surfaces of the trench 143, and a metal layer 146 is formed on the glue layer 144, in accordance with some embodiments. An S/D contact structure 148 is constructed by the glue layer 144 and the metal layer 146. The S/D contact structure 148 is electrically connected to the S/D structure 124. A top surface of the S/D contact structure 148 is higher than a top surface of the gate structure 140.

Figure 1K:
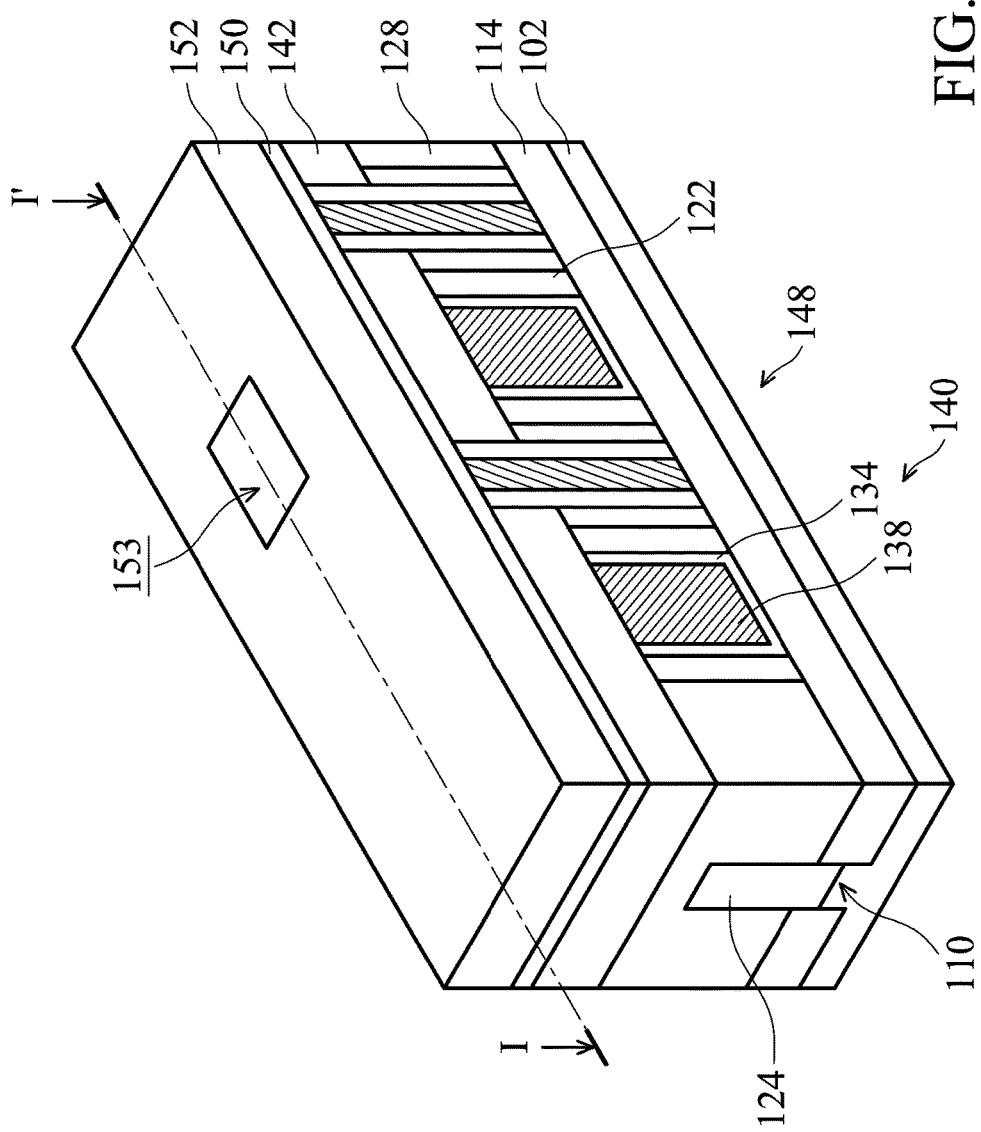

Afterwards, as shown in FIG. 1K, an etching stop layer 150 and a second dielectric layer 152 are formed on the first dielectric layer 142, and then a portion of the second dielectric layer 152, a portion of the etching stop layer 150 and a portion of the first dielectric layer 142 are removed to form a first hole 153 above the gate structure 140, in accordance with some embodiments.

Figure 1L:
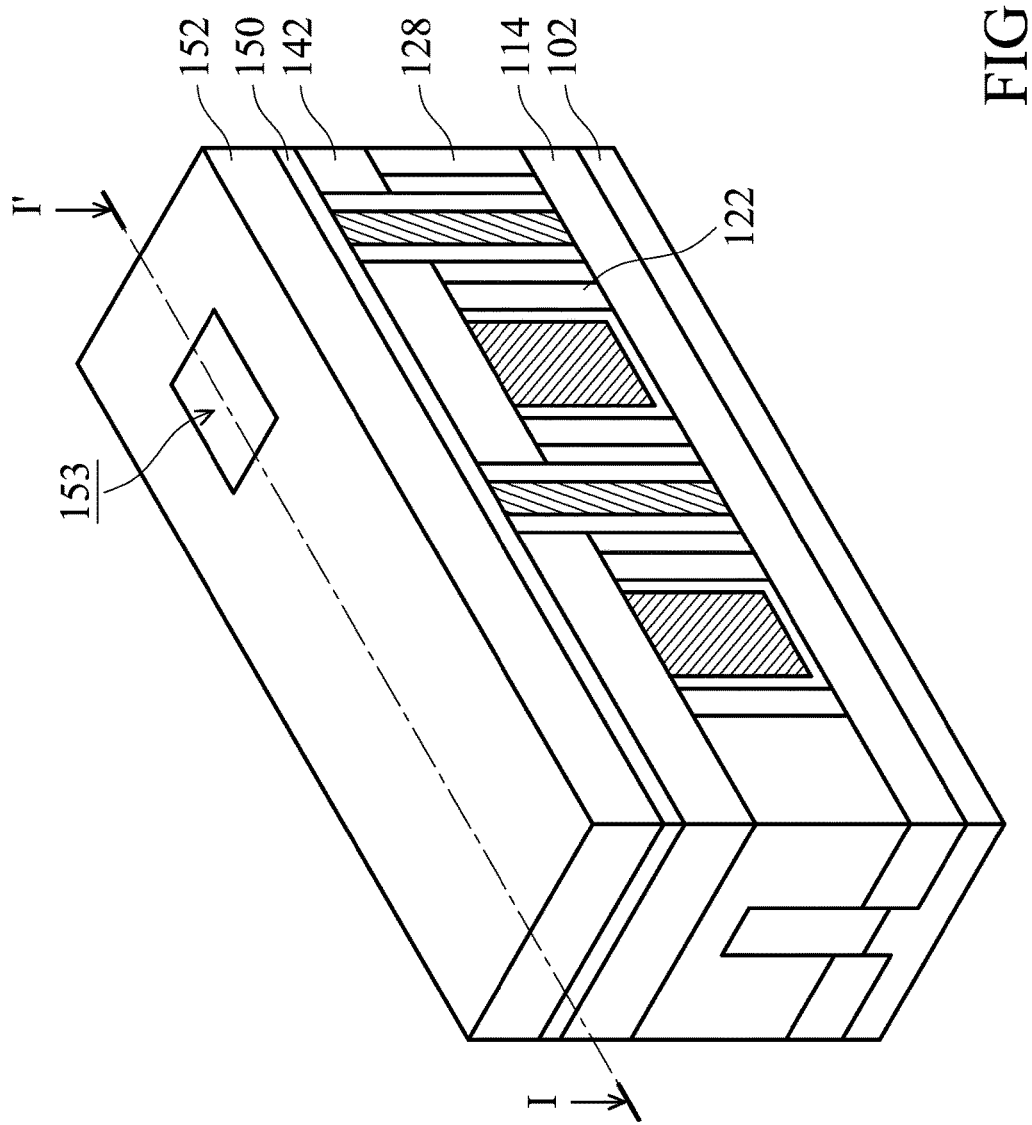

Next, as shown in FIG. 1L, a first conductive layer 154 is selectively formed over the gate electrode layer 138, in accordance with some embodiments. More specifically, the first conductive layer 154 is formed in and over the gate electrode layer 138. The first conductive layer 154 is configured to reduce the contact resistance between the gate electrode layer 138 and the second conductive layer 164 (formed later, shown in FIG. 2E). The first conductive layer 154 is a part of the gate contact structure 166 (shown in FIG. 2E).

Figure 2A:
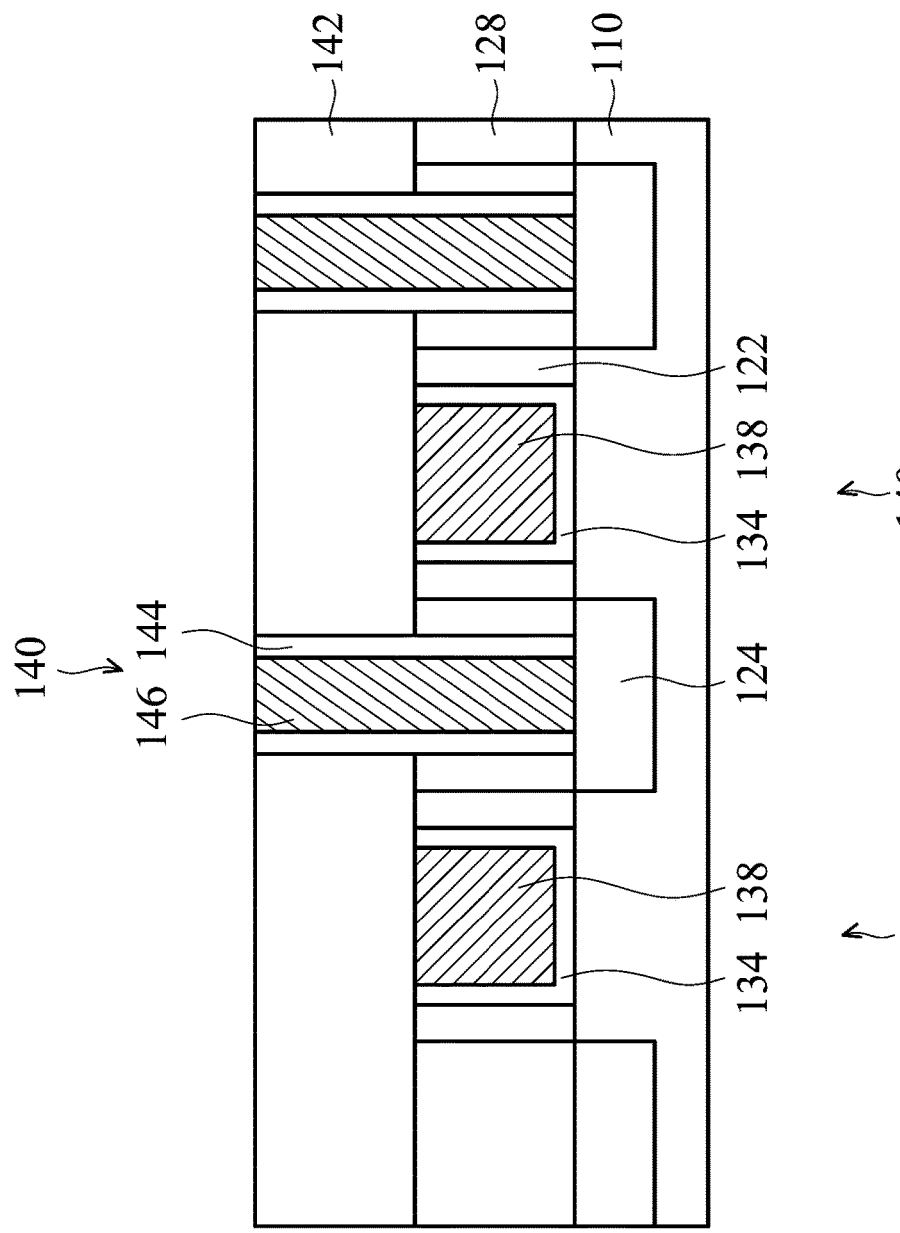
FIGS. 2A-2E show cross-sectional representations of various stages of forming a FinFET device structure shown in FIG. 1J-1N, in accordance with some embodiments of the disclosure.
Figure 2B:
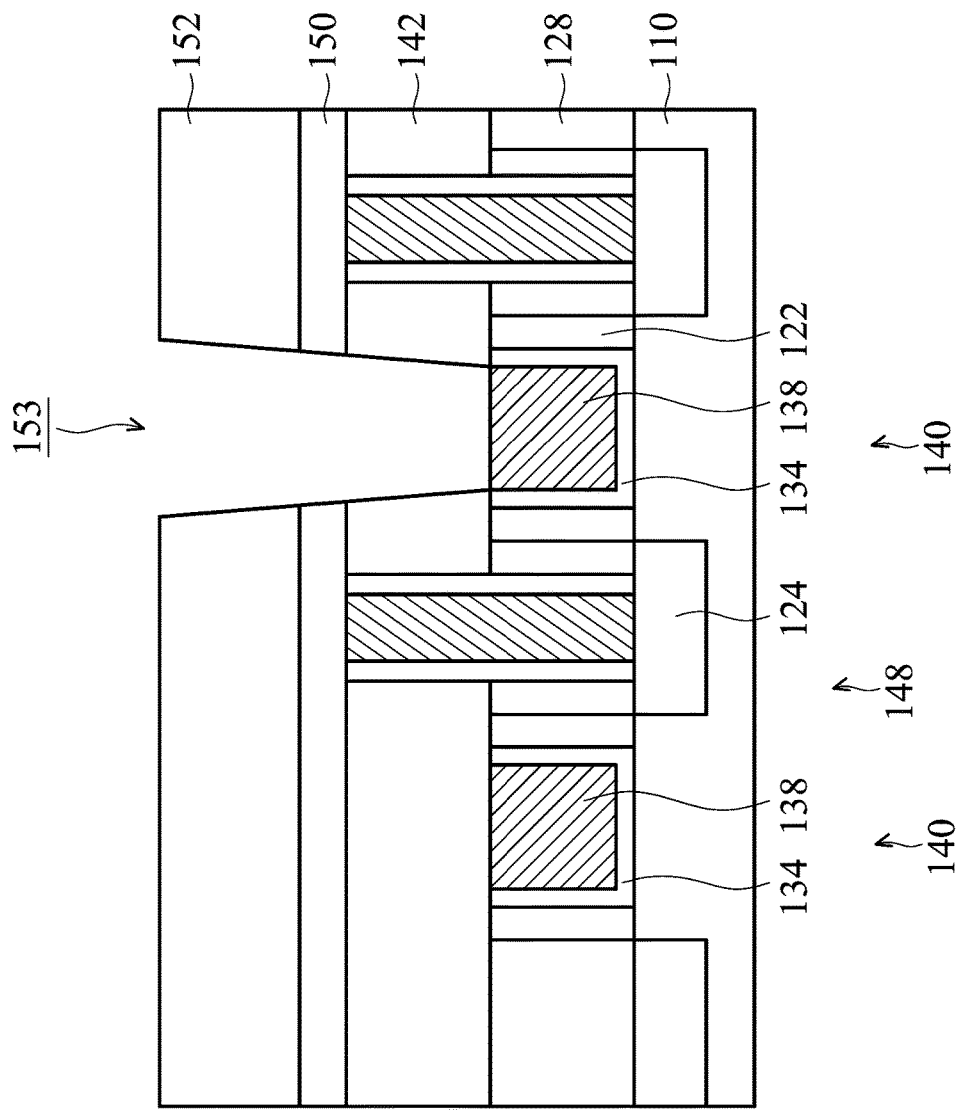
Figure 2C:
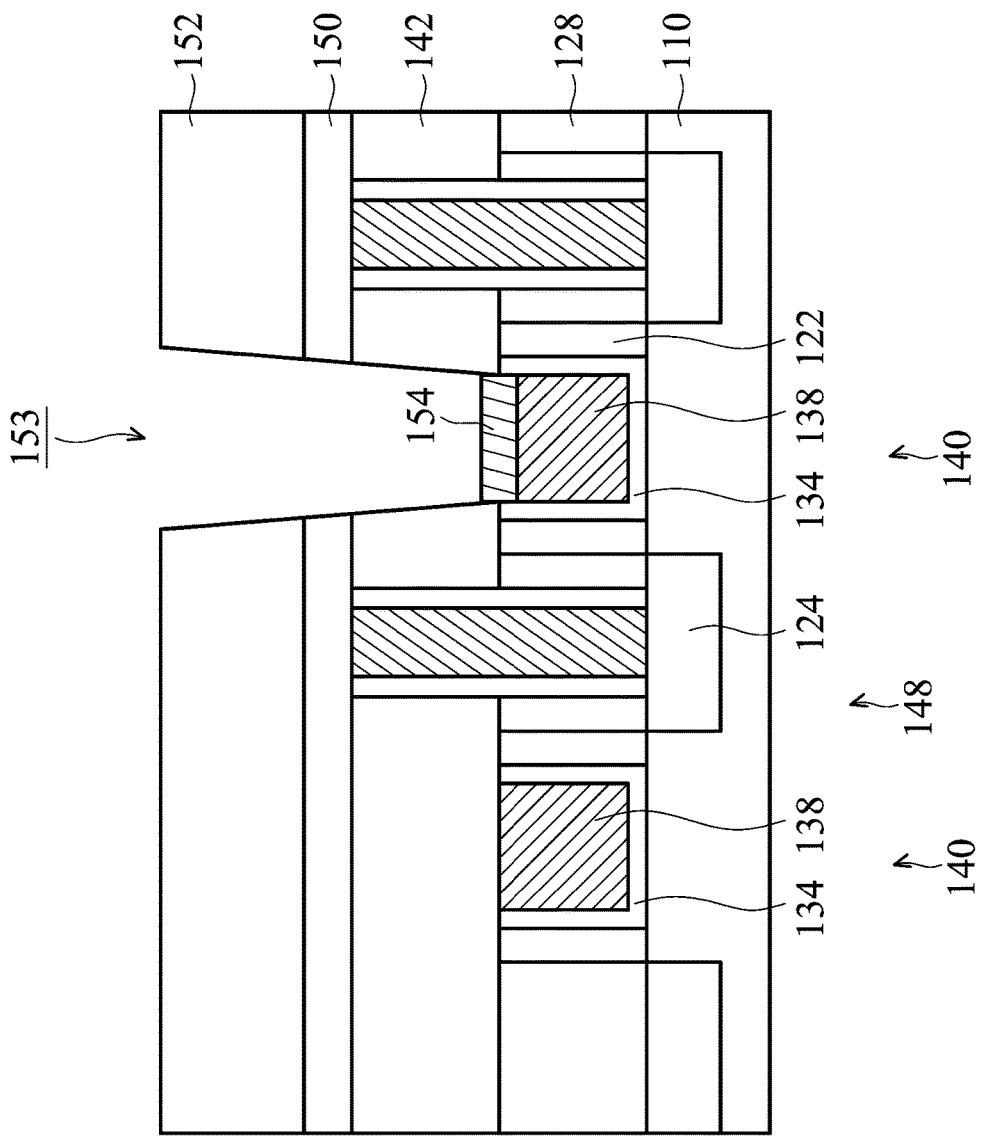

It should be noted that as shown in FIG. 2C (the cross-sectional view of FIG. 1L), the first conductive layer 154 is selectively formed on the gate electrode layer 138 of the gate structure 140, but not formed on the gate dielectric layer 134. In addition, a portion of the first conductive layer 154 is embedded in the gate structure 140. The bottom surface of the first conductive layer 154 is lower than a top surface of the gate dielectric layer 134. A top surface of the first conductive layer 154 is higher than a bottom surface of the S/D contact structure 148 and lower than a top surface of the S/D contact structure 148.

The first conductive layer 154 is made of tungsten (W), cobalt (Co), titanium (Ti), aluminum (Al), copper (Cu) or gold (Au). In some embodiments, the first conductive layer 154 is formed by a deposition process, such as a chemical vapor deposition (CVD) process, physical vapor deposition (PVD) process, atomic layer deposition (ALD) process, plating process or another application process. The fabricating method of the first conductive layer 154 will be described in the FIG. 2C in more detail.

Figure 1M:
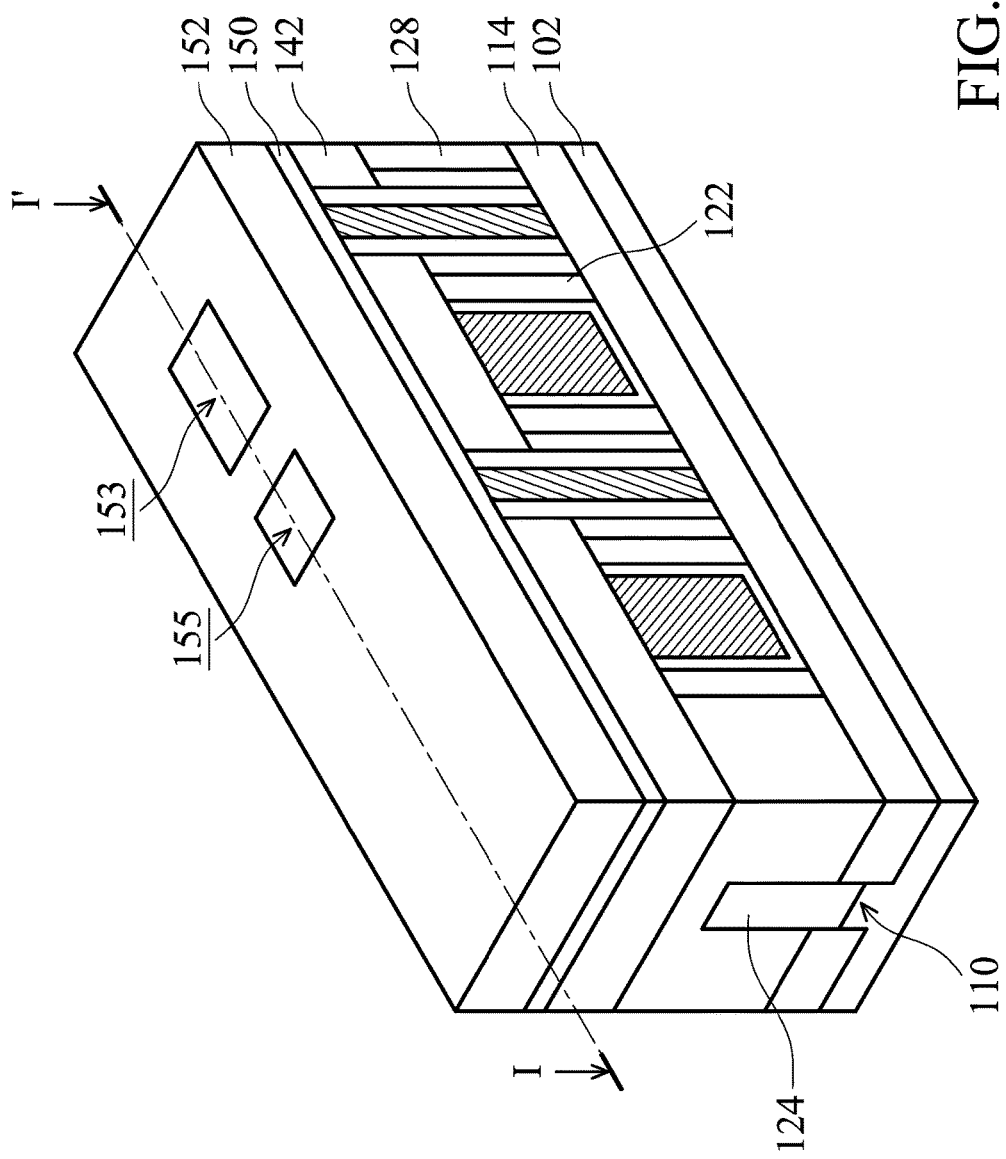
Figure 1N:
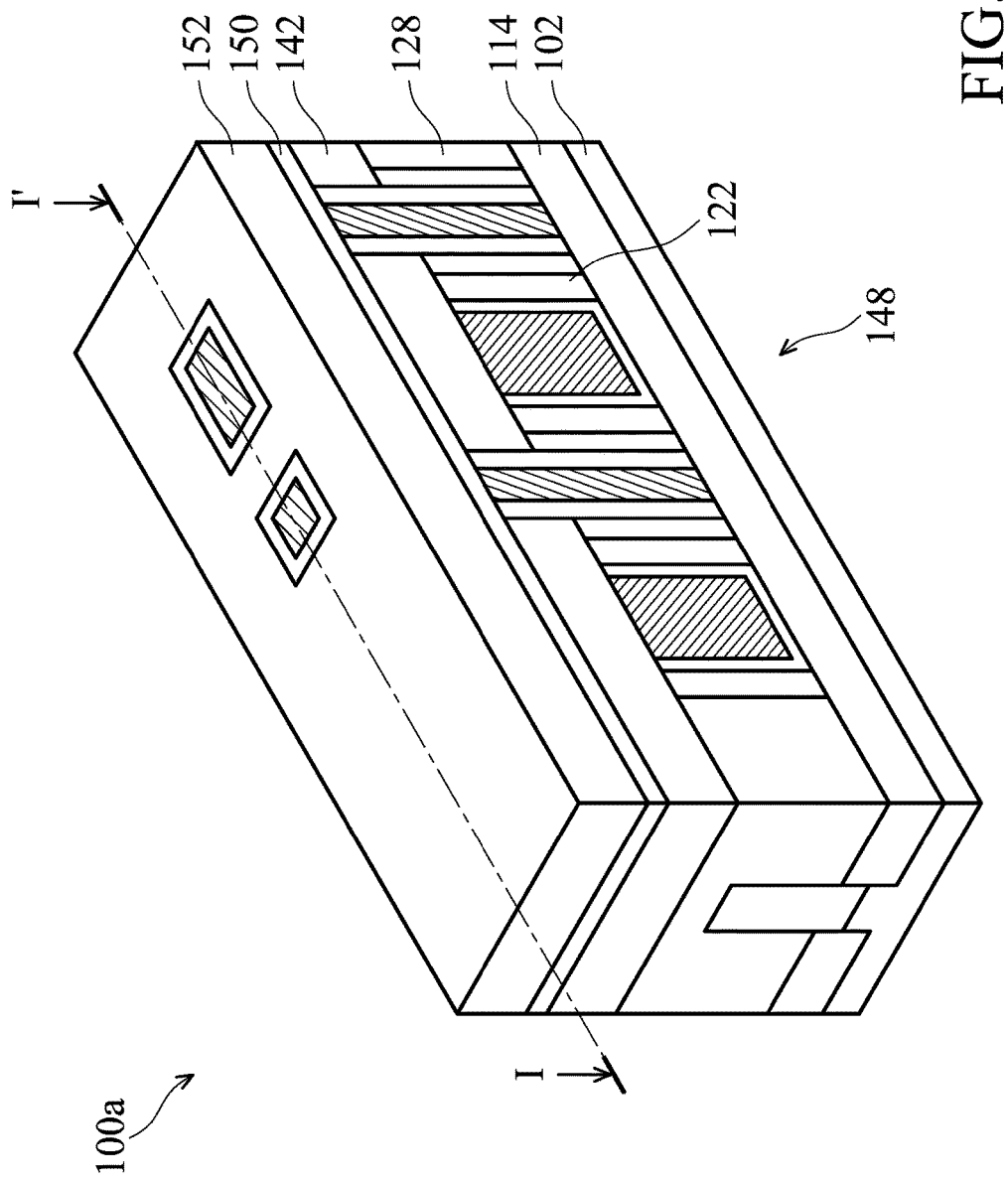

Afterwards, as shown in FIG. 1M, a portion of the second dielectric layer 152 and a portion of the etching stop layer 150 are removed to form a second hole 155 above the S/D contact structure 148, in accordance with some embodiments.

Next, as shown in FIG. 1N, a barrier layer 162 is formed in the first hole 153 and the second hole 155, and a second conductive layer 164 is formed over the barrier layer 162, in accordance with some embodiments. The first hole 153 is filled with the barrier layer 162 and the second conductive layer 164, and the gate contact structure 166 is constructed by the first conductive layer 154, the barrier layer 162 and the second conductive layer 164. The second hole 155 is filled with the barrier layer 162 and the second conductive layer 164 to form an S/D conductive plug 168.

The gate contact structure 166 is electrically connected to the gate electrode layer 138. The S/D conductive plug 168 is directly above the S/D contact structure 148. The S/D conductive plug 168 is electrically connected to the S/D structures 124 by the S/D contact structure 148. In some embodiments, the grain size of the second conductive layer 164 is greater than the grain size of the first conductive layer 154 to have a lower the contact resistance.

In some embodiments, the barrier layer 162 is made of tantalum (Ta), tantalum nitride (TaN), titanium (Ti), titanium nitride (TiN), cobalt tungsten (CoW) or another applicable material. In some embodiments, the barrier layer 162 is formed by a deposition process, such as a chemical vapor deposition (CVD) process, physical vapor deposition (PVD) process, atomic layer deposition (ALD) process, plating process or another application process.

In some embodiments, the second conductive layer 164 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the second conductive layer 164 is formed by a deposition process, such as a chemical vapor deposition (CVD) process, physical vapor deposition (PVD) process, atomic layer deposition (ALD) process, plating process or another application process. The material of the first conductive layer 154 may be the same or different from that of the second conductive layer 164.

A first interface is between the first conductive layer 154 and the gate electrode layer 138, a second interface is between the first conductive layer 154 and the second conductive layer 164. The first interface has a first resistance, the second interface has a second resistance, and the second resistance is lower than the first resistance. Therefore, the contact resistance between the gate electrode layer 138 and the second conductive layer 164 is reduced by forming the first conductive layer 154.

It should be noted that as the dimension of the gate structure 140 is gradually decreased, the filling of the gate material into the trench 130 becomes difficulty. As a result, there is no enough space to fill the low-resistance material. Therefore, the first conductive layer 154 of the disclosure is formed between the gate electrode layer 138 and the second conductive layer 164 to reduce the contact resistance between the gate electrode layer 138 and the second conductive layer 164 of the gate contact structure 166.

FIGS. 2A-2E show cross-sectional representations of various stages of forming a FinFET device structure 100a shown in FIG. 1J-1N, in accordance with some embodiments of the disclosure. FIG. 2A is a cross-sectional representation taken along the II' line of FIG. 1J.

As shown in FIG. 2A, the glue layer 144 is formed in the sidewall surfaces of the trench 143, and the metal layer 146 is formed on the glue layer 144, in accordance with some embodiments. The S/D contact structure 148 is constructed by the glue layer 144 and the metal layer 146. The S/D contact structure 148 is electrically connected to the S/D structure 124.

Next, as shown in FIG. 2B, the etching stop layer 150 and the second dielectric layer 152 are formed on the first dielectric layer 142, and a first hole 153 directly above the gate structure 140 is formed by removing a portion of the second dielectric layer 152, a portion of the etching stop layer 150 and a portion of the first dielectric layer 142, in accordance with some embodiments. The top surface of the gate electrode layer 138 is exposed by the first hole 153. The first hole 153 has a tapered width from top to bottom. In other words, the first hole 153 has a top width and a bottom width, and the top width is greater than the bottom width.

Afterwards, as shown in FIG. 2C, the first conductive layer 154 is selectively formed over the gate electrode layer 138, in accordance with some embodiments. A portion of the first conductive layer 154 is embedded in the gate electrode layer 138. A portion of the first conductive layer 154 is extended above the top surface of the gate dielectric layer 134. The bottom surface of the first conductive layer 154 is lower than the top surface of the gate dielectric layer 134. The first conductive layer 154 is configured to reduce the contact resistance between the gate electrode layer 138 and the second conductive layer of the gate contact structure 166 (formed later).

Before forming the first conductive layer 154, the top surface of the gate electrode layer 138 is exposed by the first hole 153. In some embodiments, a surface treatment process is performed on the top surface of the gate electrode layer 138 to facilitate the following deposition process for forming the first conductive layer 154. In some embodiments, the surface treatment process is performed by using oxygen ($O_2$) plasma, nitrogen ($N_2$) and oxygen ($O_2$) plasma, or ammonia ($NH_3$) plasma.

In some embodiments, the native oxide is formed on the top surface of the gate electrode layer 138, but the native oxide is not distributed uniformly. In order to thicken the native oxide layer, in some embodiments, the oxygen ($O_2$) plasma is used to form a uniform oxide layer on the overall top surface of the gate electrode layer 138. Afterwards, the uniform oxide layer is removed and replaced by the first conductive layer 154 to form a uniform first conductive layer 154.

In some other embodiments, the nitrogen ($N_2$) plasma or the ammonia ($NH_3$) plasma is used. The nitrogen ($N_2$) plasma or the ammonia ($NH_3$) plasma is used to break the chemical bonds of the gate electrode layer 138 and to form new chemical bonds with the first conductive layer 154.

In some embodiments, the surface treatment process is operated at a temperature in a range from about 150 degrees to about 350 degrees. In some embodiments, the surface treatment process is operated at a pressure in a range from about 50 mtorr to about 4000 mtorr. In some embodiments, the surface treatment process is operated at RF power in a range from about 50 W to about 5000 W. In some embodiments, the gas flow in the surface treatment process is in a range from about 100 sccm to about 10000 sccm. In some embodiments, the surface treatment process is operated for a period of time in a range from about 10 seconds to about 50 seconds.

After the surface treatment process, a deposition process is performed on the gate electrode layer 138 to form the first conductive layer 154. During the deposition process, the native oxide is removed and replaced by the first conductive layer 154, and therefore a portion of the first conductive layer 154 is embedded in the gate structure 140. The deposition is selectively on the gate electrode layer 138, and not on the gate dielectric layer 134.

In some embodiments, the deposition process is an ALD process. The ALD process is performed by using a precursor gas. The precursor gas may include a compound with metal element and halogen element. The compound may be tungsten chloride ($WCl_5$), tungsten fluoride ($WF_6$), titanium chloride ($TiCl_4$) or another applicable material. Furthermore, the precursor gas may further include hydrogen ($H_2$) or silane ($SiH_4$). In some embodiments, the precursor gas includes tungsten chloride ($WCl_5$) and hydrogen ($H_2$). In some other embodiments, the precursor gas includes tungsten fluoride ($WF_6$) and silane ($SiH_4$).

In some embodiments, the deposition process is operated at a temperature in a range from about 400 degrees to about 520 degrees. In some embodiments, the deposition process is operated at a pressure in a range from about 5 torr to about 50 torr. In some embodiments, the deposition process is operated for a period of time in a range from about 10 minutes to about 120 minutes.

Figure 2D:
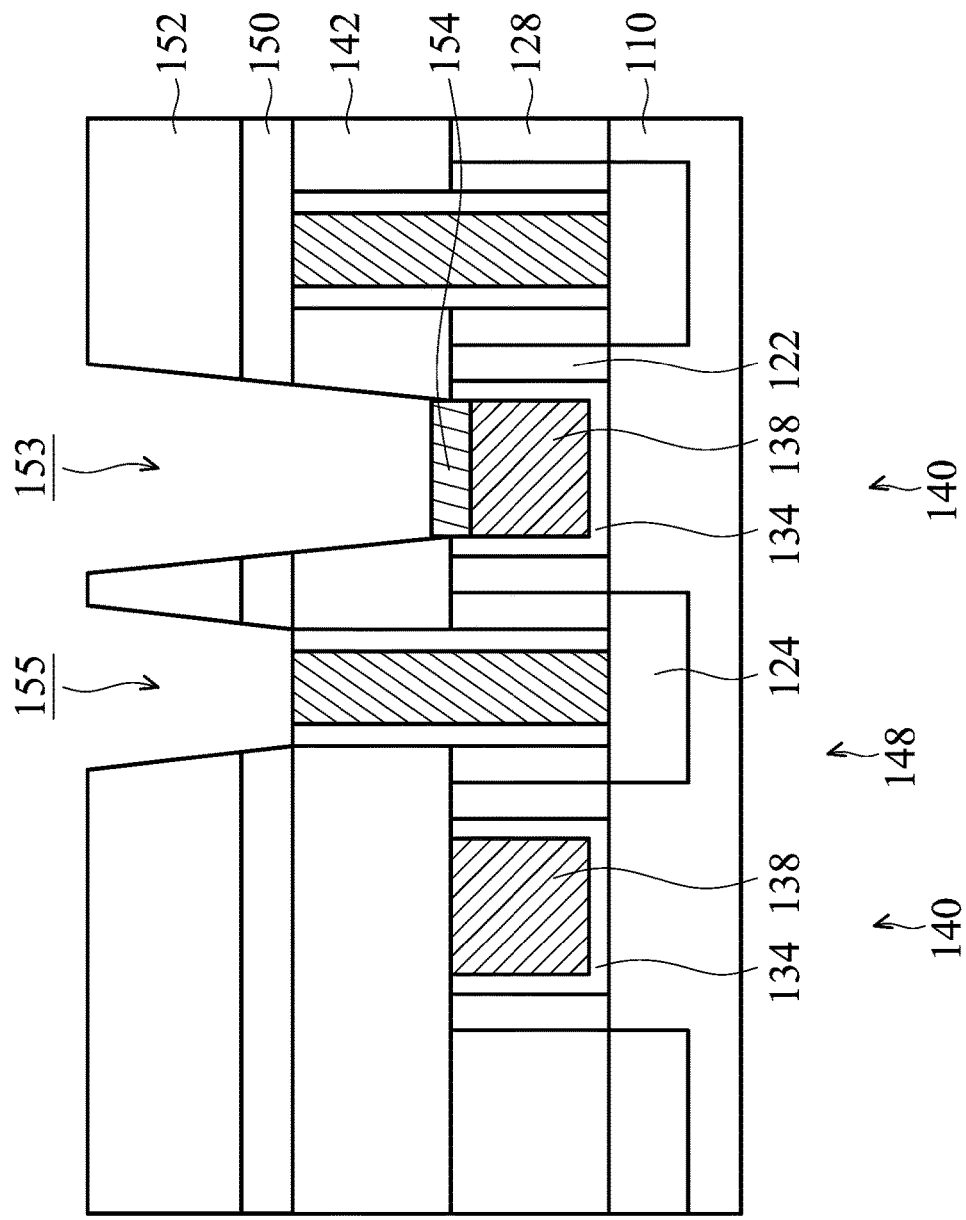

Next, as shown in FIG. 2D, the second hole 155 directly above the S/D contact structure 148 is formed by removing a portion of the second dielectric layer 152 and a portion of the etching stop layer 150, in accordance with some embodiments. The first hole 153 is deeper than the second hole 155. The top surface of the S/D contact structure 148 is exposed by the second hole 155. The second hole 155 has a tapered width from top to bottom.

Figure 2E:
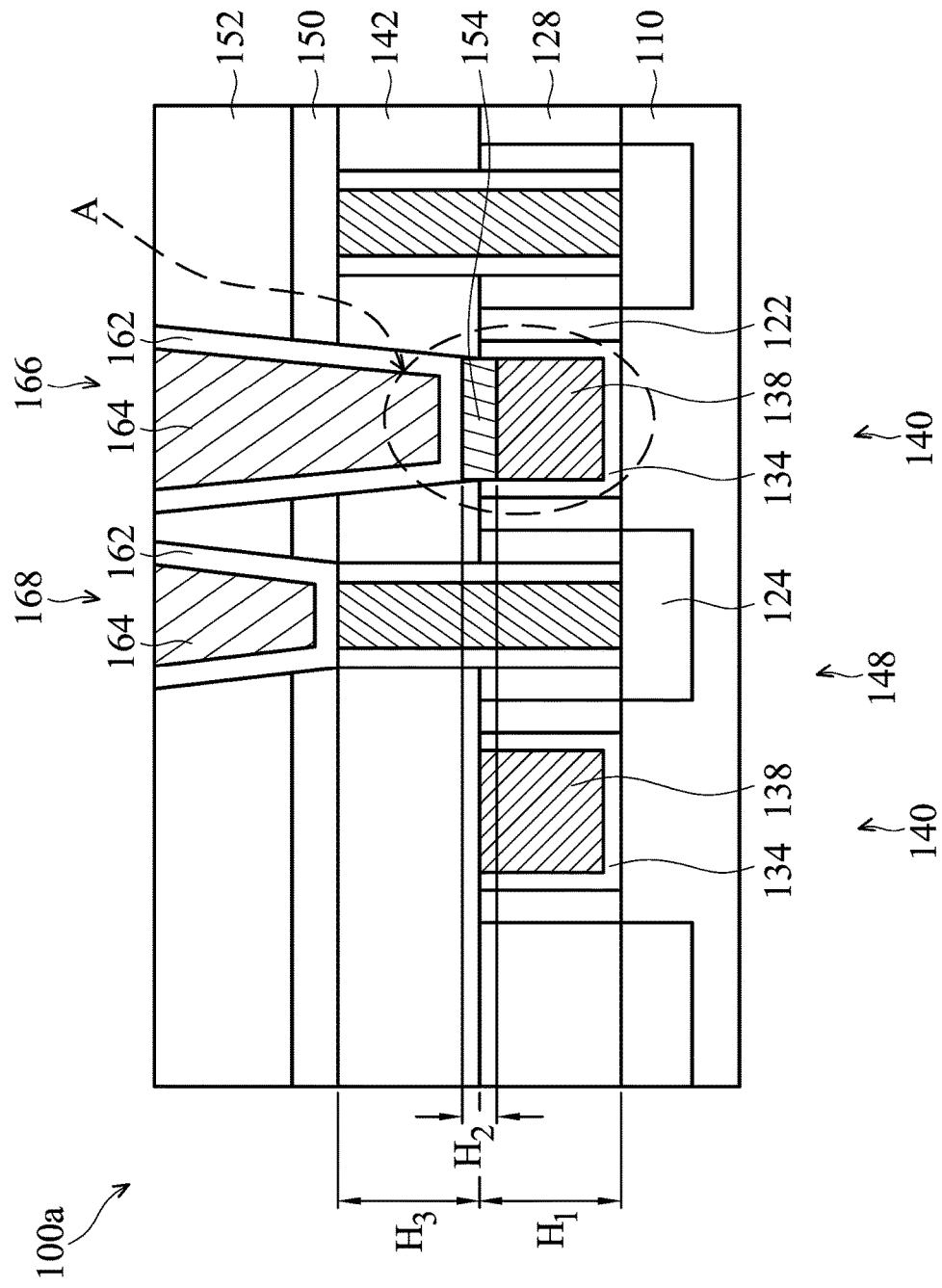
Figure 2E:
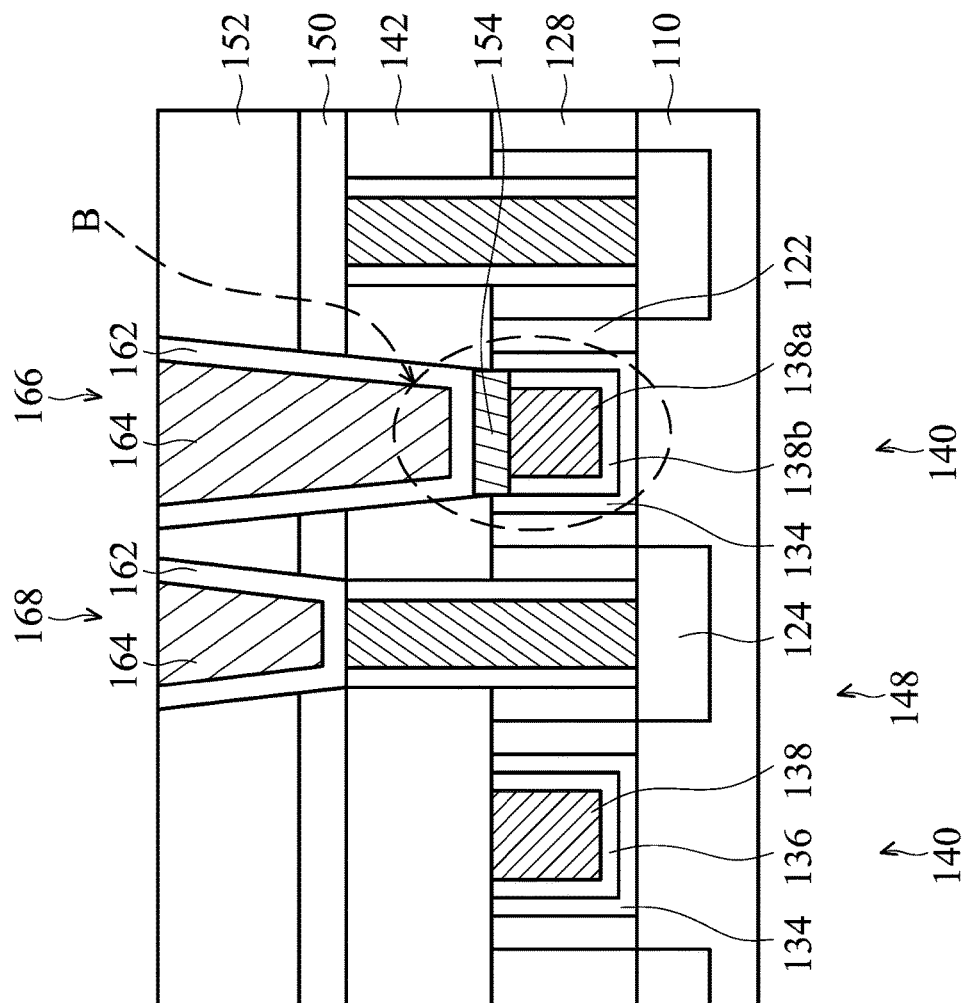

Afterwards, as shown in FIG. 2E, the first hole 153 is filled with the barrier layer 162 and the second conductive layer 164, and the second hole 155 is filled with the barrier layer 162 and the second conductive layer 164 to form the S/D conductive plug 168, in accordance with some embodiments.

The gate structure 140 has a height $H_1$, and the first conductive layer 154 has a second height $H_2$. The first dielectric layer 142 has a third height $H_3$. In some embodiments, the first height $H_1$ is in a range from about 10 nm to about 35 nm. In some embodiments, the second height $H_2$ is in a range from about 2 nm to about 5 nm. In some embodiments, the third height $H_3$ is in a range from about 5 nm to about 25 nm.

It should be noted that the contact resistance between the second conductive layer 164 and the first conductive layer 154 is lower than the contact resistance between the first conductive layer 154 and the gate electrode layer 138 of the gate structure 140. Therefore, the contact resistance between the second conductive layer 164 of the gate contact structure 166 and the gate electrode layer 138 is greatly reduced by interposing the first conductive layer 154. When the contact resistance between the second conductive layer 164 of the gate contact structure 166 and the gate electrode layer 138 is reduced, the performance of the FinFET device structure 100a is improved.

Furthermore, the native oxide layer formed on the gate electrode layer 138 is reduced or eliminated by forming the first conductive layer 154. In addition, the aspect ratio of the first hole 153 for filling the second conductive layer 164 is reduced due to formation of the first conductive layer 154.

FIG. 2E' shows a cross-sectional representation of a modified FinFET device structure 100b, in accordance with some embodiments of the disclosure. The FinFET device structure of FIG. 2E' is similar to the FinFET device structure of FIG. 2E, the difference between FIGS. 2E and 2E' is that the gate electrode layer 138 includes a first layer 138a and a second layer 138b. The first conductive layer 154 is formed on the first layer 138a and the second layer 138b of the gate electrode layer.

The first layer 138a of the gate electrode layer 138 and the second layer 138b of the gate electrode layer 138 are made of different work function materials. The work function material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

FIG. 2E" shows a cross-sectional representation of a modified FinFET device structure 100c, in accordance with some embodiments of the disclosure. The FinFET device structure of FIG. 2E" is similar to the FinFET device structure of FIG. 2E, the difference between FIGS. 2E and 2E" is that the gate electrode layer 138 includes a first layer 138a, a second layer 138b and a third layer 138c in FIG. 2E". The first conductive layer 154 is formed on the first layer 138a, the second layer 138b and the third layer 138c of the gate electrode layer 138. The first layer 138a, the second layer 138b and the third layer 138c are made of different materials.

Figure 3A:
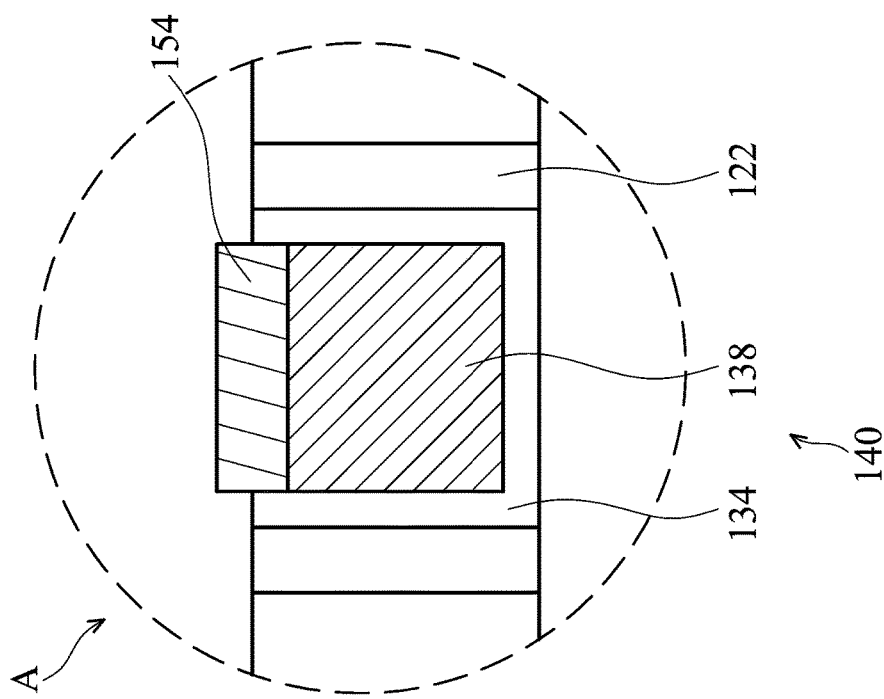
FIG. 3A is an enlarged cross-sectional representation of region A of FIG. 2E.

FIG. 3A is an enlarged cross-sectional representation of region A of FIG. 2E. The first conductive layer 154 is directly above the gate electrode layer 138. The first conductive layer 154 is not formed on the gate dielectric layer 134 and the gate spacer layers 122. A portion of the first conducive layer 154 is formed in the gate structure 140.

Figure 3B:
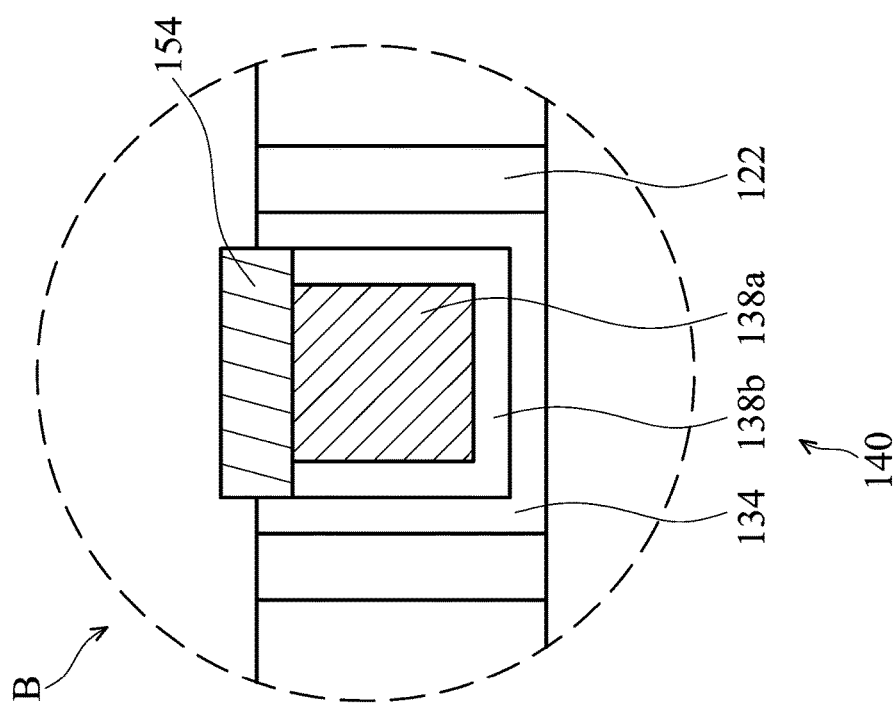
FIGS. 3B-3C show enlarged cross-sectional representations of region B of FIG. 2E'.
Figure 3C:
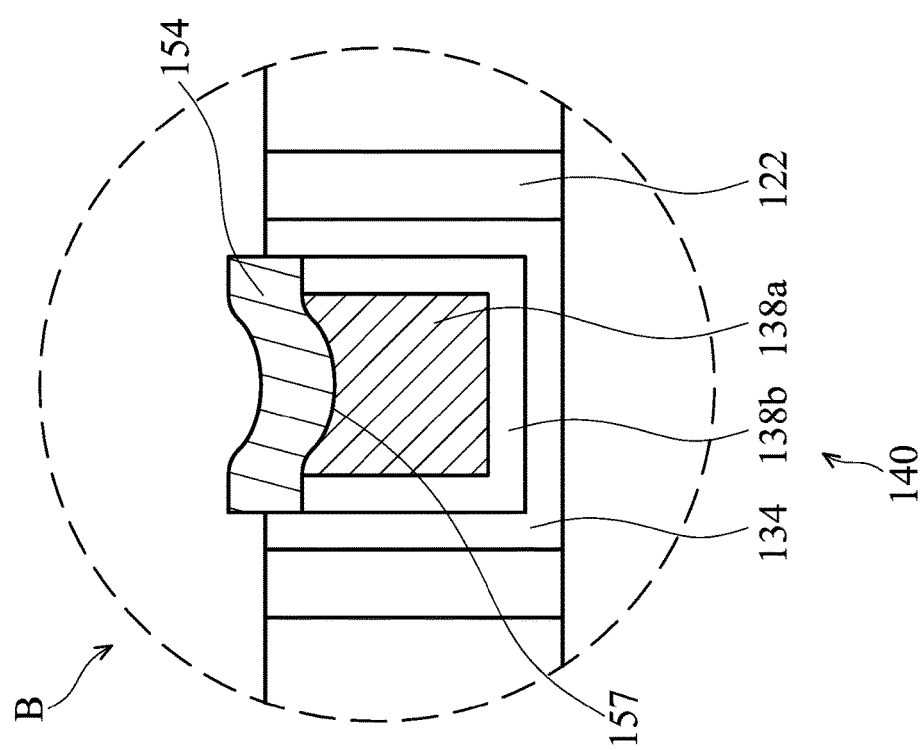

FIGS. 3B-3C show enlarged cross-sectional representations of region B of FIG. 2E'. As shown in FIG. 3B, the first conductive layer 154 is formed on the first layer 138a and the second layer 138b of the gate electrode layer 138.

As shown in FIG. 3C, the first conductive layer 154 is formed on the first layer 138a and the second layer 138b of the gate electrode layer 138. The first conductive layer 154 includes an embedded portion which is below a top surface of the gate dielectric layer 134, and the embedded portion has a protrusion portion 157 extending away from the top surface of the gate dielectric layer 134. The protrusion portion 157 penetrates into the first layer 138a of the gate electrode layer 138, but not into the second layer 138b and the gate dielectric layer 134. Since the material of the first layer 138a of the gate electrode layer 138 is different from the material of the second layer 138b, the depths of the first portion of the native oxide layer on the first layer 138a of the gate electrode layer 138 is different than the depths of the second portion of the native oxide layer on the second layer 138b. The native oxide layer with different depths is replaced by the first conductive layer 154, and therefore the first conductive layer 154 is formed to have different depths. As a result, the first conductive layer 154 has a uneven top surface and uneven bottom surface.

Figure 3D:
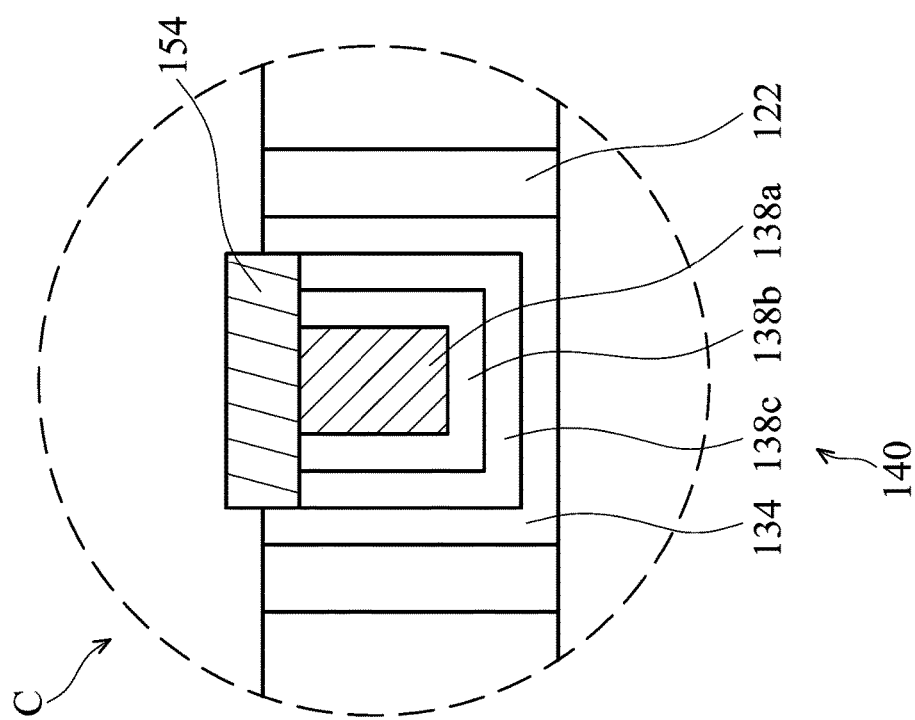
FIGS. 3D-3F show enlarged cross-sectional representations of region C of FIG. 2E".
Figure 3E:
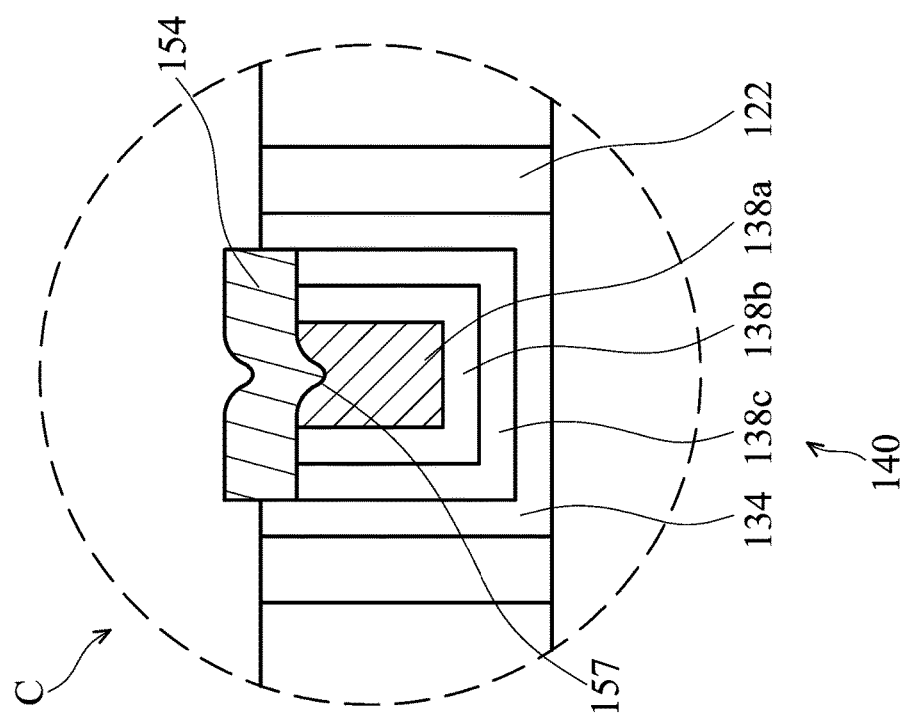
Figure 3F:
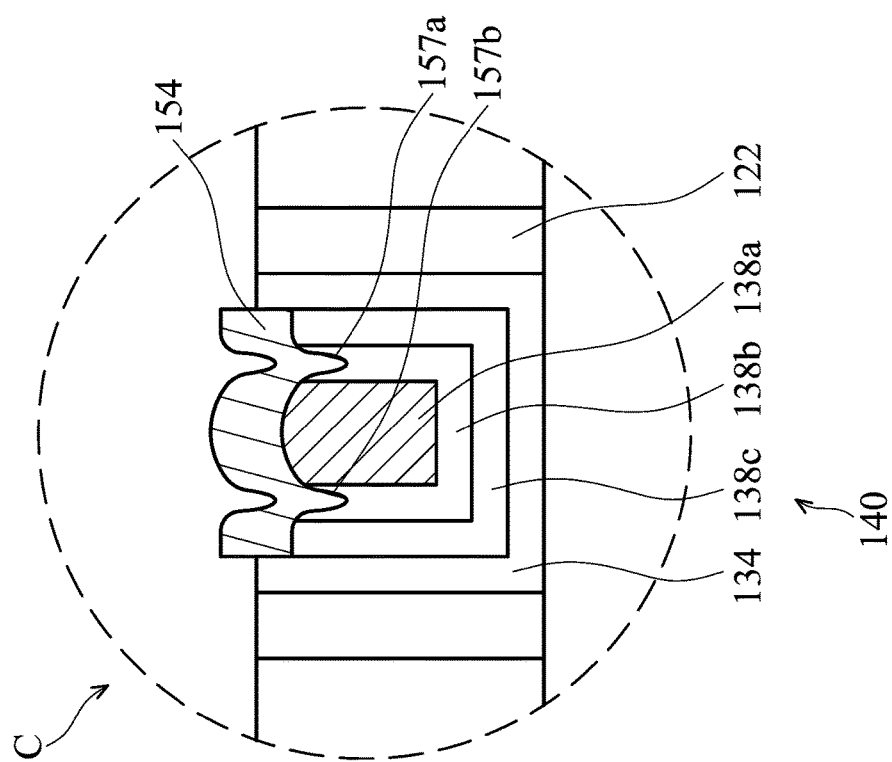

FIGS. 3D-3F show enlarged cross-sectional representations of region C of FIG. 2E". As mentioned above, the gate structure 140 includes the gate dielectric layer 134, the first layer 138a, the second layer 138b and the third layer 138c of the gate electrode layer 138.

As shown in FIG. 3D, the first conductive layer 154 is formed on the first layer 138a, the second function layer 138b and the third layer 138c of the gate electrode layer 138. The outer sidewall surface of the third layer 138c of the gate electrode layer is substantially aligned with the outer sidewall surface of the first conductive layer 154.

As shown in FIG. 3E, the protrusion portion 157 penetrates into the gate electrode layer 138. More specifically, there are two protrusion portions 157a, 157b which penetrates into the second layer 138b.

Figure 4:
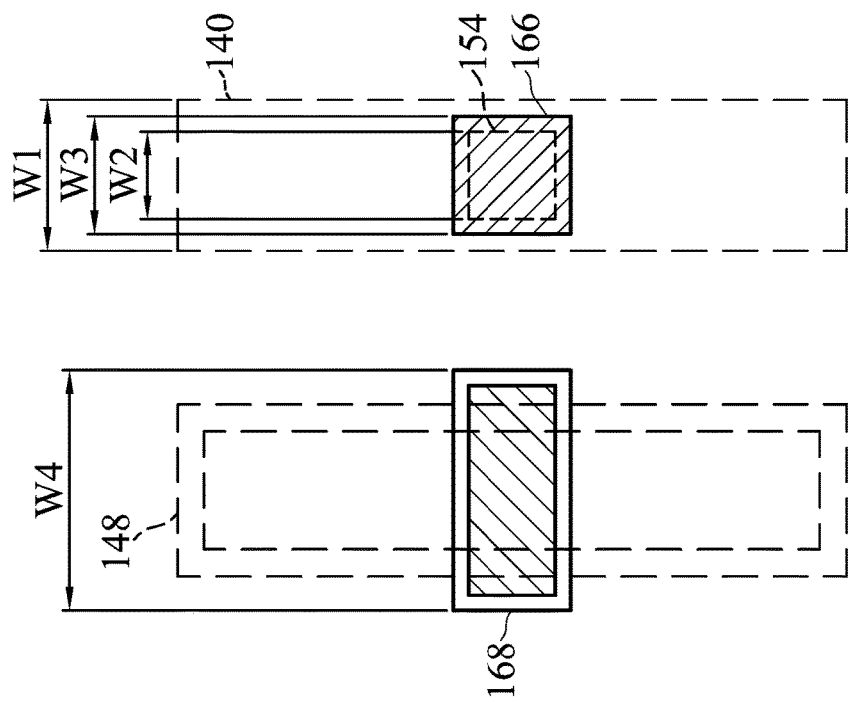
FIG. 4 shows a top-view of FinFET device structure, in accordance with some embodiments of the disclosure.

FIG. 4 shows a top-view of FinFET device structure 100a, in accordance with some embodiments of the disclosure. The first conductive layer 154 is formed on the gate structure 140, and the second conductive layer 164 is formed on the first conductive layer 154. The top view of the first conductive layer 154 may have various shapes, such as circular, square, rectangle or other shapes.

The gate structure 140 has a first width $W_1$ (also called the gate length). The first conductive layer 154 has a second width W2. The top surface of the second conductive layer 164 has a third width $W_3$. The S/D conductive plug 168 has a fourth width $W_4$. The first width $W_1$ is greater than the second width $W_2$. The third width $W_3$ is greater than the second width $W_2$, and the first width $W_1$ is greater than the third width $W_3$. The fourth width $W_4$ is greater than the third width $W_3$. In some embodiments, the first width $W_1$ (also called gate length) of the gate structure 140 is in a range from about 13 nm to about 28 nm. In some embodiments, the second width $W_2$ of the first conductive layer 154 is in a range from about 10 nm to about 16 nm. In some embodiments, the fourth width $W_4$ is in a range from about 12 nm to about 18 nm.

FIGS. 5A-5H show perspective representations of various stages of forming a FinFET device structure 200a, in accordance with some embodiments of the disclosure. Some processes and materials used to form the FinFET device structure 200a are similar to, or the same as, those used to form the FinFET device structure 100a and are not repeated herein.

Figure 5A:
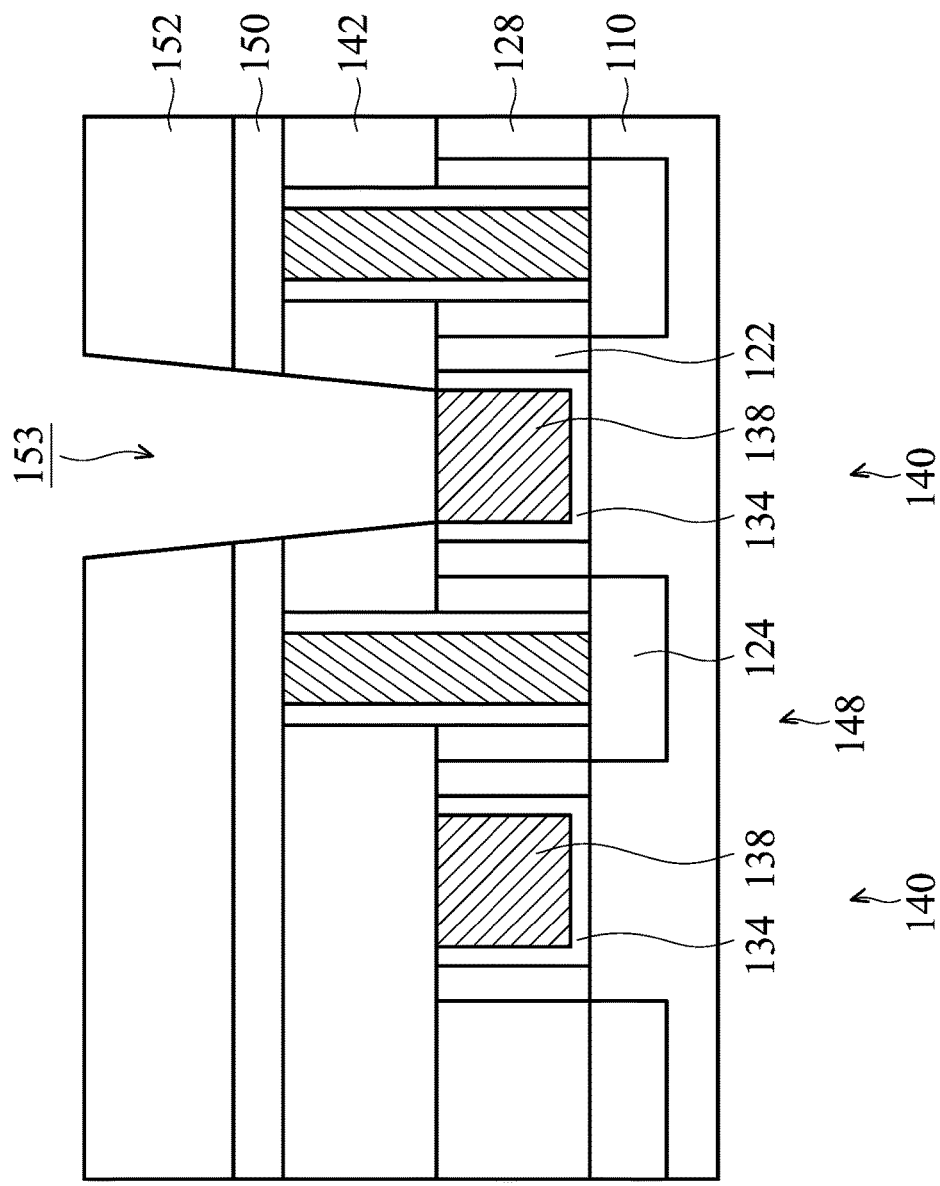
FIGS. 5A-5H show perspective representations of various stages of forming a FinFET device structure, in accordance with some embodiments of the disclosure.

As shown in FIG. 5A, the first hole 153 is formed on the gate structure 140. The top surface of the gate electrode layer 138 is exposed by the first hole 153. The first hole 153 has a tapered width from top to bottom.

Figure 5B:
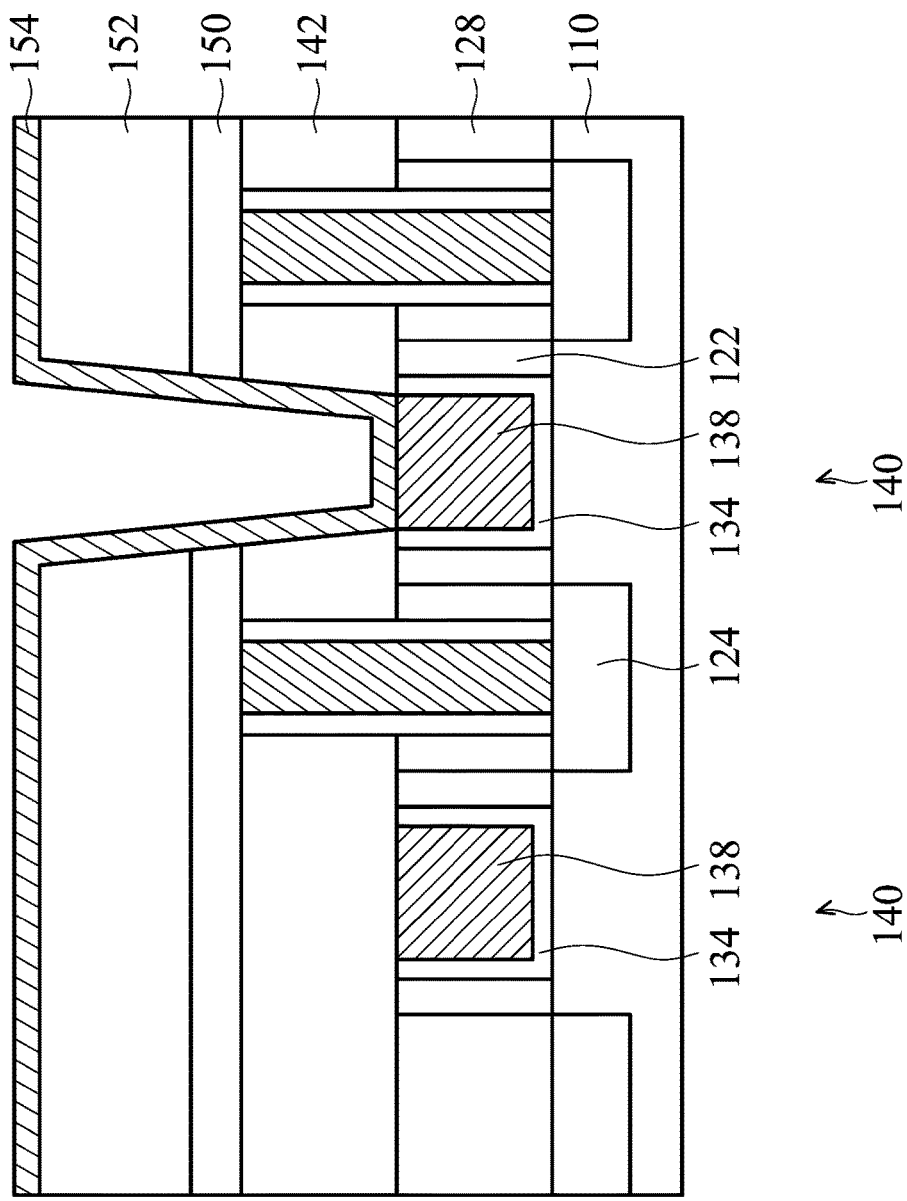

Afterwards, as shown in FIG. 5B, the first conductive layer 154 is formed on sidewall surfaces and the bottom surface of the first hole 153, in accordance with some embodiments of the disclosure. The first conductive layer 154 is conformally formed on the top surface of the second dielectric layer 152 and sidewall surfaces of the first hole 153.

Figure 5C:
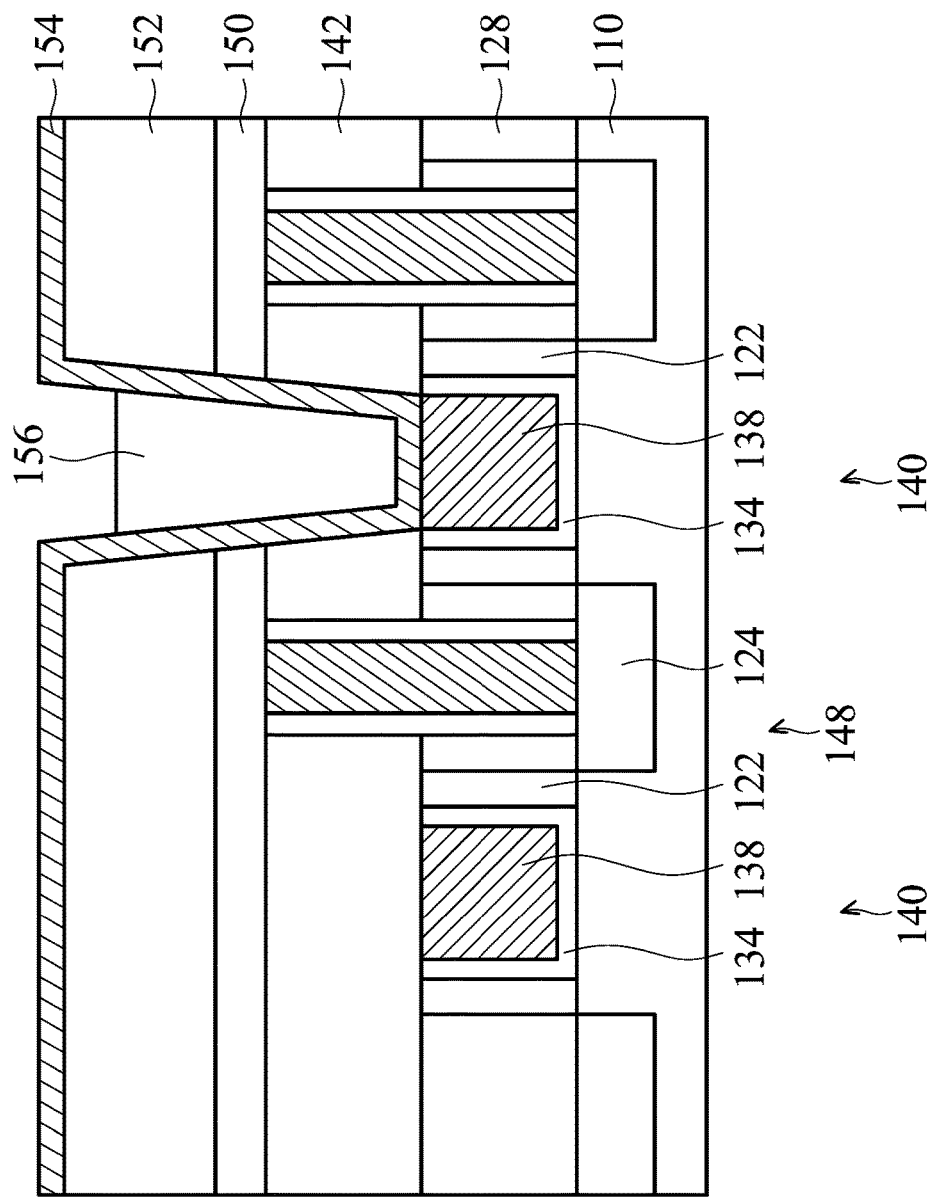

Next, as shown in FIG. 5C, a photoresist (PR) layer 156 is formed on the first conductive layer 154 and in a portion of the first hole 153, in accordance with some embodiments of the disclosure. The PR layer 156 is used as a protection layer to protect the first conductive layer 154 from being etched in the following process.

Figure 5D:
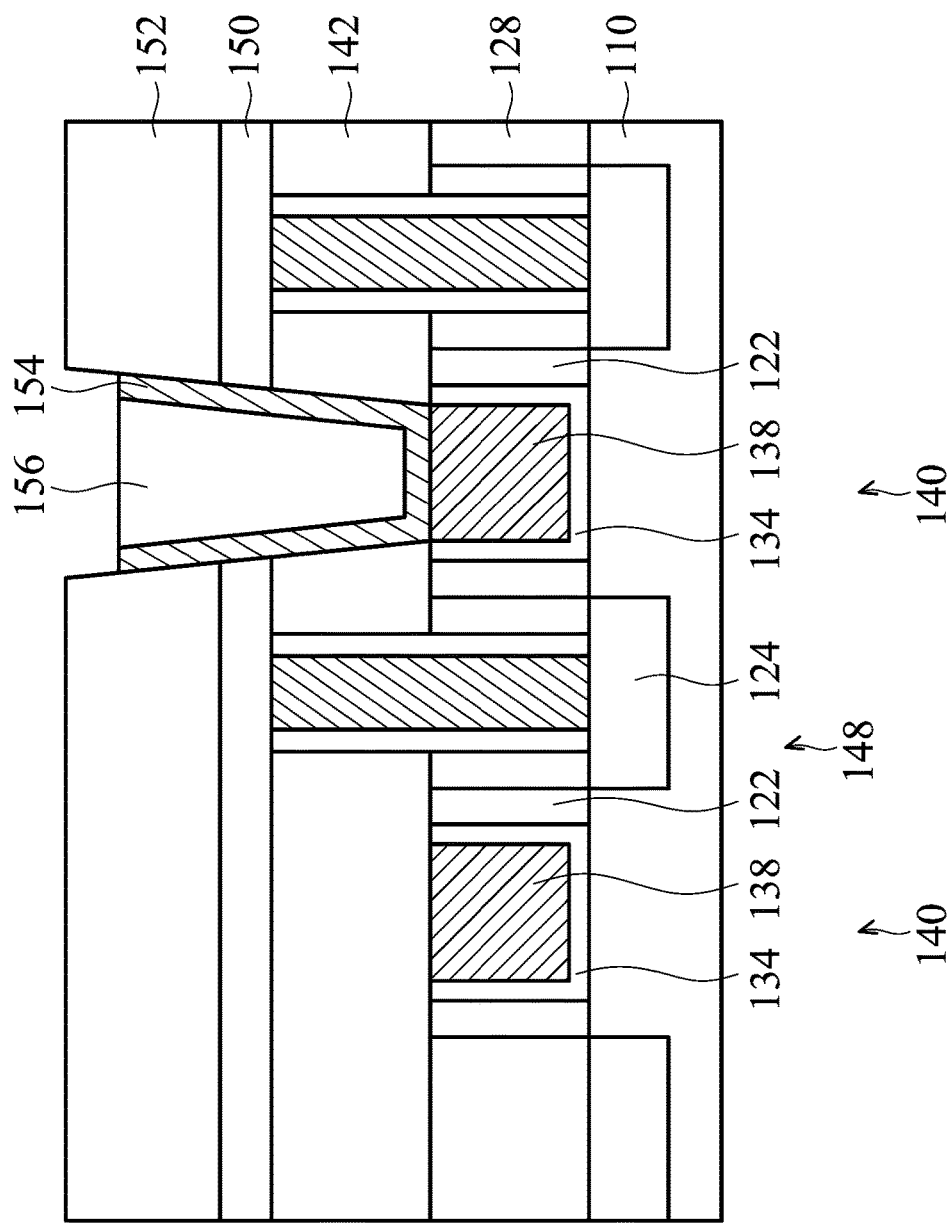

Subsequently, as shown in FIG. 5D, a portion of the first conductive layer 154 is removed, in accordance with some embodiments of the disclosure. The portion of the first conductive layer 154 above the second dielectric layer 152 is removed, but another portion which is protected by the PR layer 156 is not removed. The remaining first conductive layer 154 has a U-shaped structure, and the PR layer 156 is in the middle portion of the U-shaped structure.

Figure 5E:
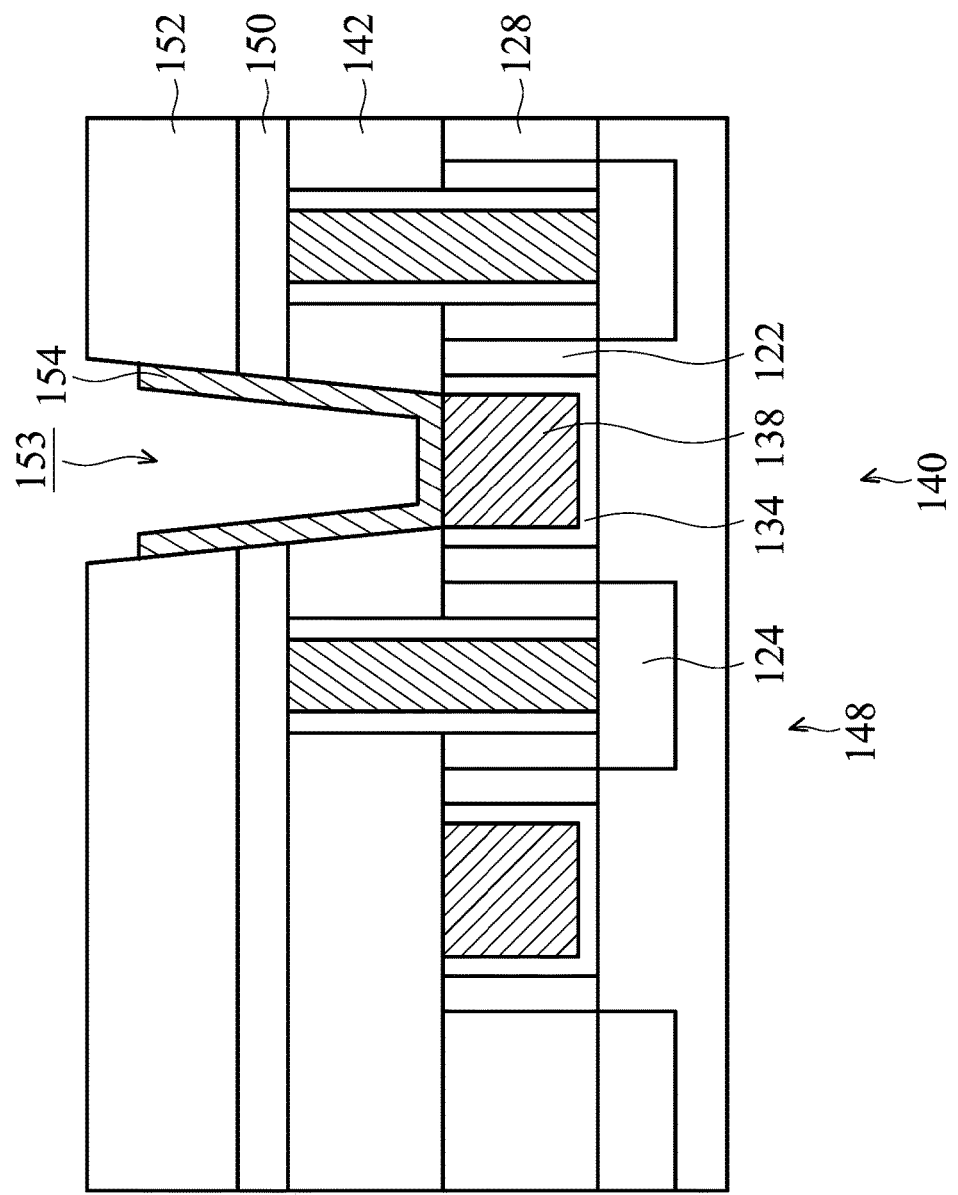

Next, as shown in FIG. 5E, the PR layer 156 is removed, in accordance with some embodiments of the disclosure. As a result, the U-shaped first conductive layer 154 is exposed. It should be noted that the thickness of the sidewall portion of the U-shaped first conductive layer 154 is thinner than the thickness of the bottom portion of the U-shaped first conductive layer 154.

Figure 5F:
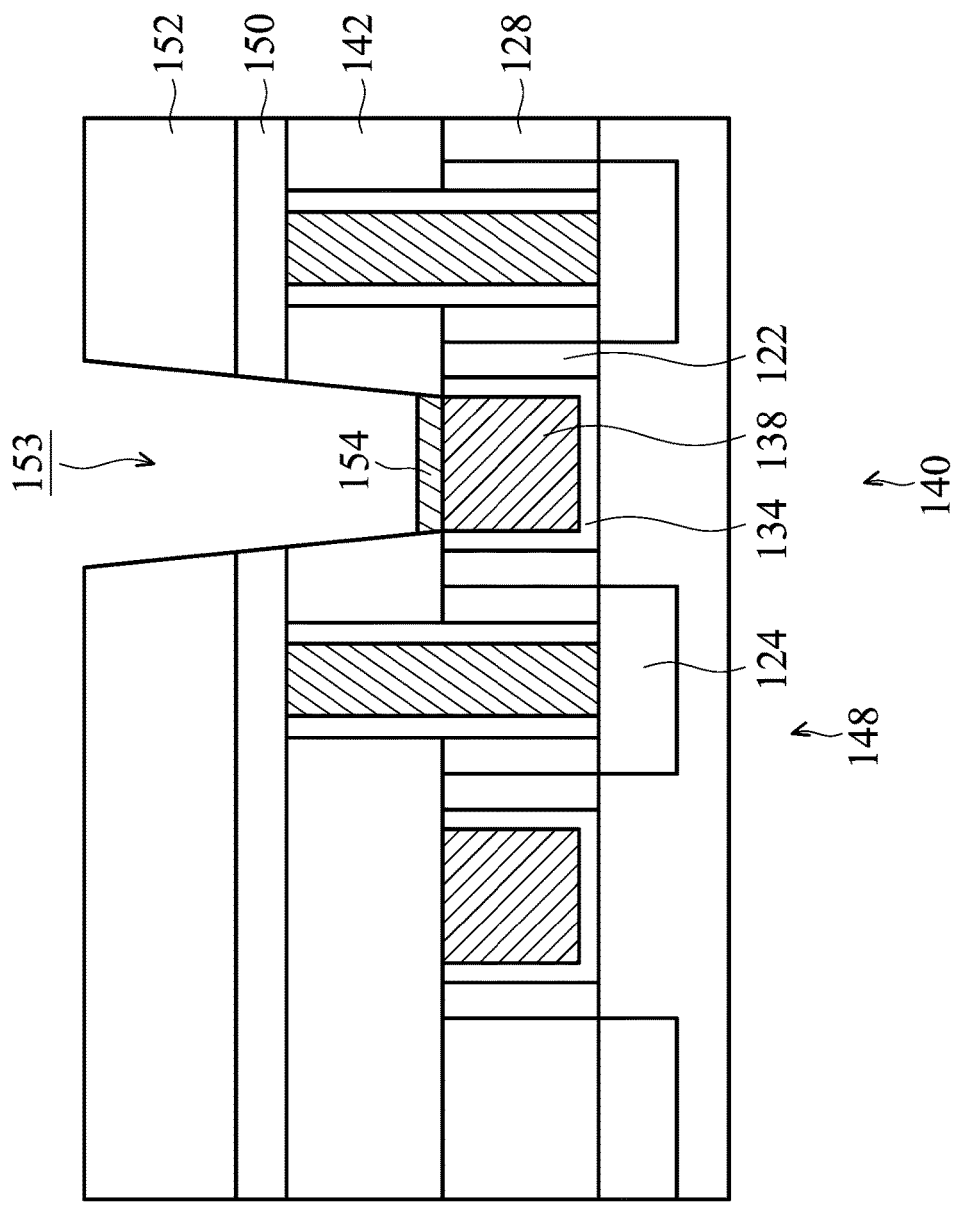

Afterwards, as shown in FIG. 5F, a portion of the first conductive layer 154 is removed, in accordance with some embodiments of the disclosure. Since the thickness of the sidewall portion of the U-shaped first conductive layer 154 is thinner than the thickness of the bottom portion of the U-shaped first conductive layer 154, the sidewall portion is removed but the bottom portion is still remaining. As a result, the first conductive layer 154 is formed on the gate electrode layer 138.

Figure 5G:
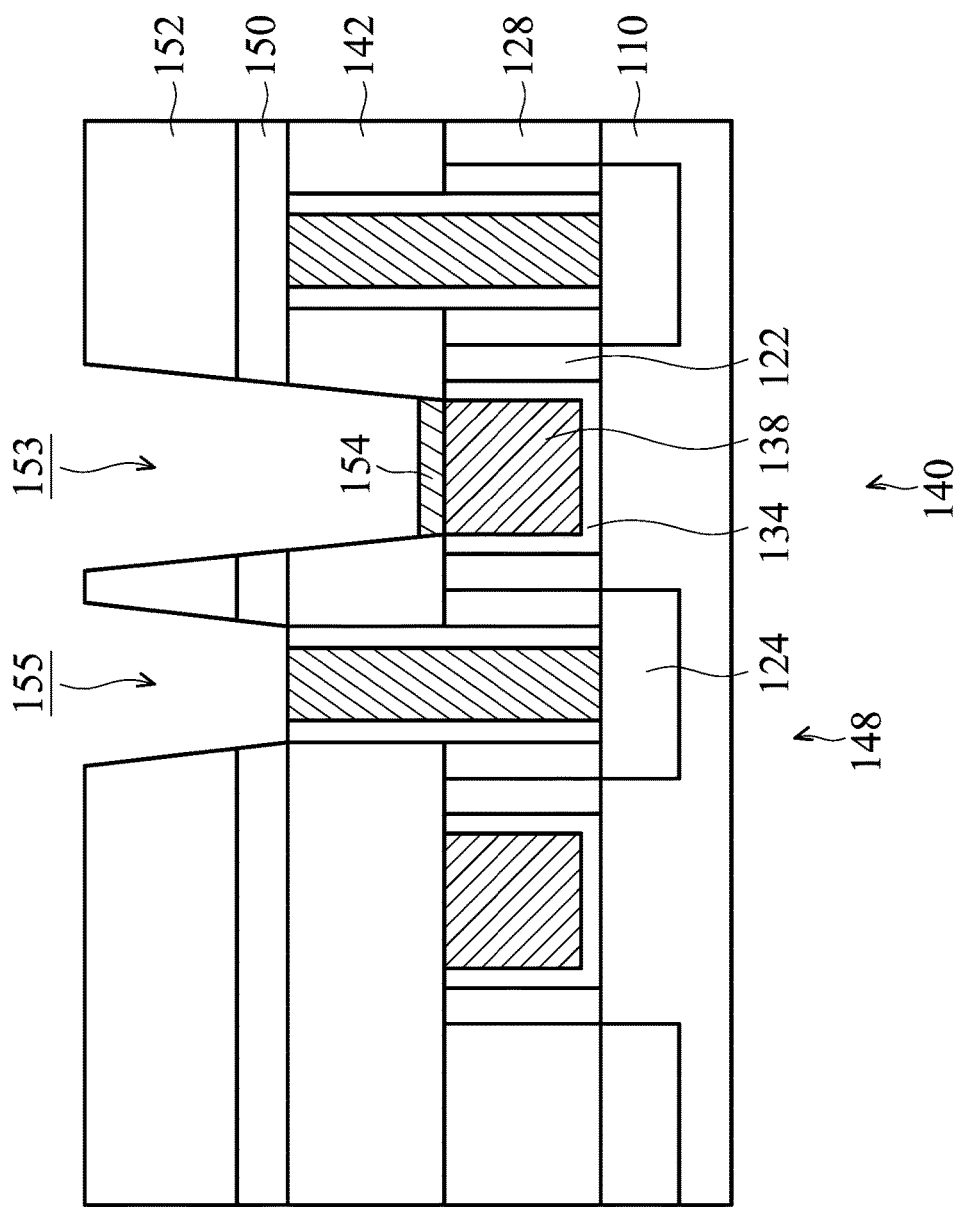

Next, as shown in FIG. 5G, the second hole 155 is formed on the S/D contact structure 148, in accordance with some embodiments of the disclosure.

Figure 5H:
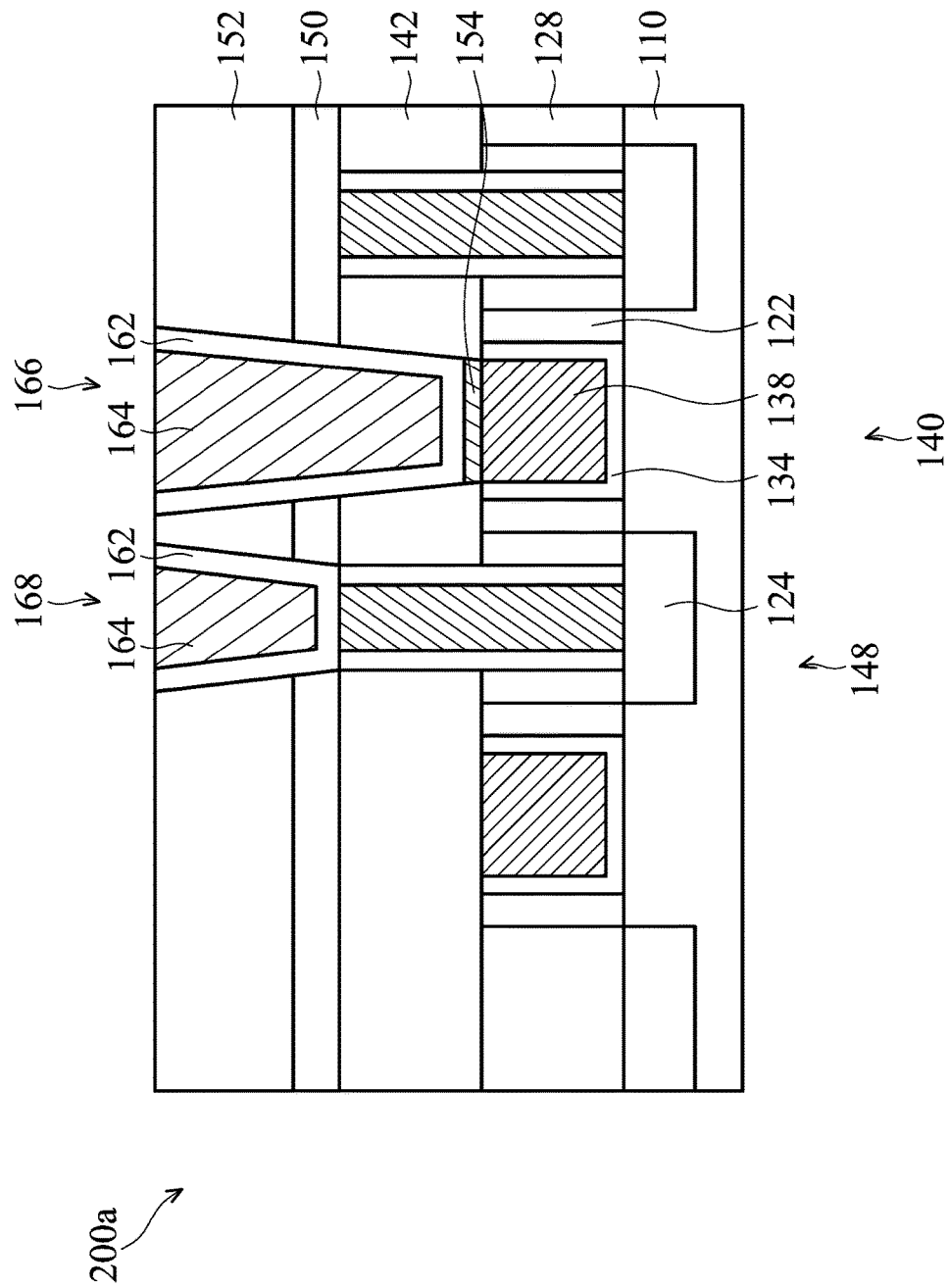
Figure 5H:
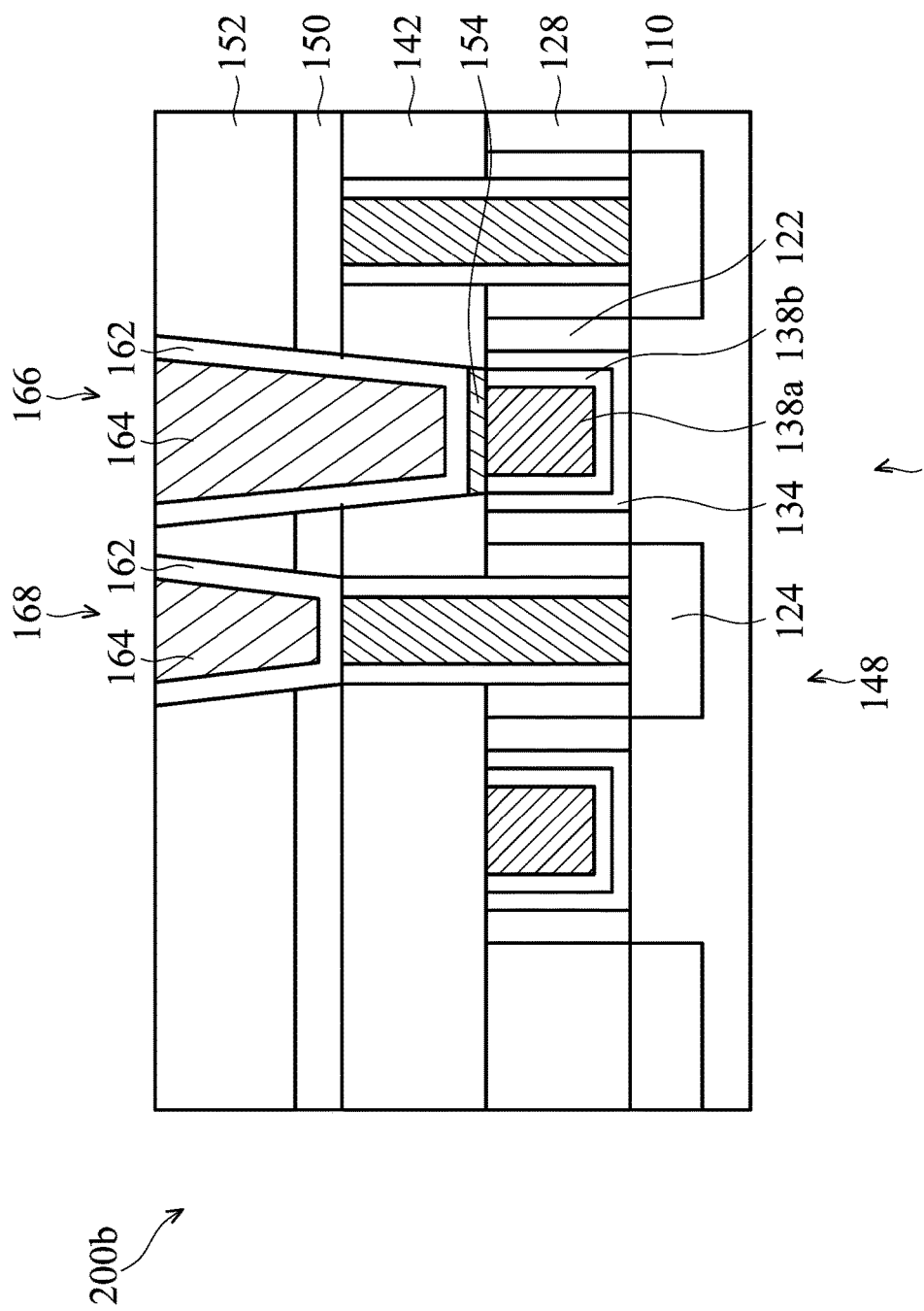

Afterwards, as shown in FIG. 5H, the barrier layer 162 is formed in the first hole 153 and the second hole 155, and the second conductive layer 164 is formed over the barrier layer 162, in accordance with some embodiments. The top portion of the gate contact structure 166 is formed by filling the first hole 153 with the barrier layer 162 and the second conductive layer 164. The S/D conductive plug 168 is formed by filling the second hole 155 with the barrier layer 162 and the second conductive layer 164.

The second conductive layer 164 is electrically connected to the gate electrode layer 138 of the gate structure 140 by the first conductive layer 154. The S/D conductive plug 168 is directly above the S/D contact structure 148. The S/D conductive plug 168 is electrically connected to the S/D structures 124 by the S/D contact structure 148.

FIG. 5H' shows a cross-sectional representation of a modified FinFET device structure 200b, in accordance with some embodiments of the disclosure. The FinFET device structure of FIG. 5H' is similar to the FinFET device structure of FIG. 5H, the difference between FIGS. 5H and 5H' is that the gate electrode layer 138 includes a first layer 138a and a second layer 138b. The first conductive layer 154 is formed on the first layer 138a and the second layer 138b.

Figure 6:
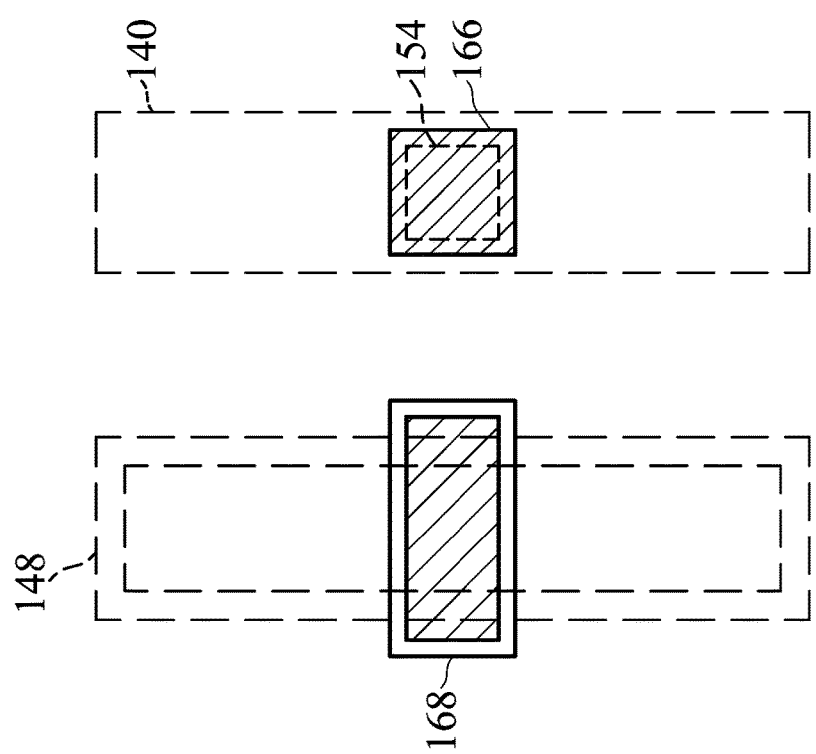
FIG. 6 shows a top-view of FinFET device structure, in accordance with some embodiments of the disclosure.

FIG. 6 shows a top-view of FinFET device structure 200a or 200b, in accordance with some embodiments of the disclosure. The first conductive layer 154 is between the gate structure 140 and the second conductive layer 164. The width of the first conductive layer 154 is smaller than the width of the gate structure 140. The S/D conductive plug 168 is formed on the S/D contact structure 148. The width of the S/D conductive plug 168 is greater than the width of the S/D contact structure 148.

FIGS. 7A-7G show perspective representations of various stages of forming a FinFET device structure 300a, in accordance with some embodiments of the disclosure. Some processes and materials used to form the FinFET device structure 300a are similar to, or the same as, those used to form the FinFET device structure 100a and are not repeated herein.

Figure 7A:
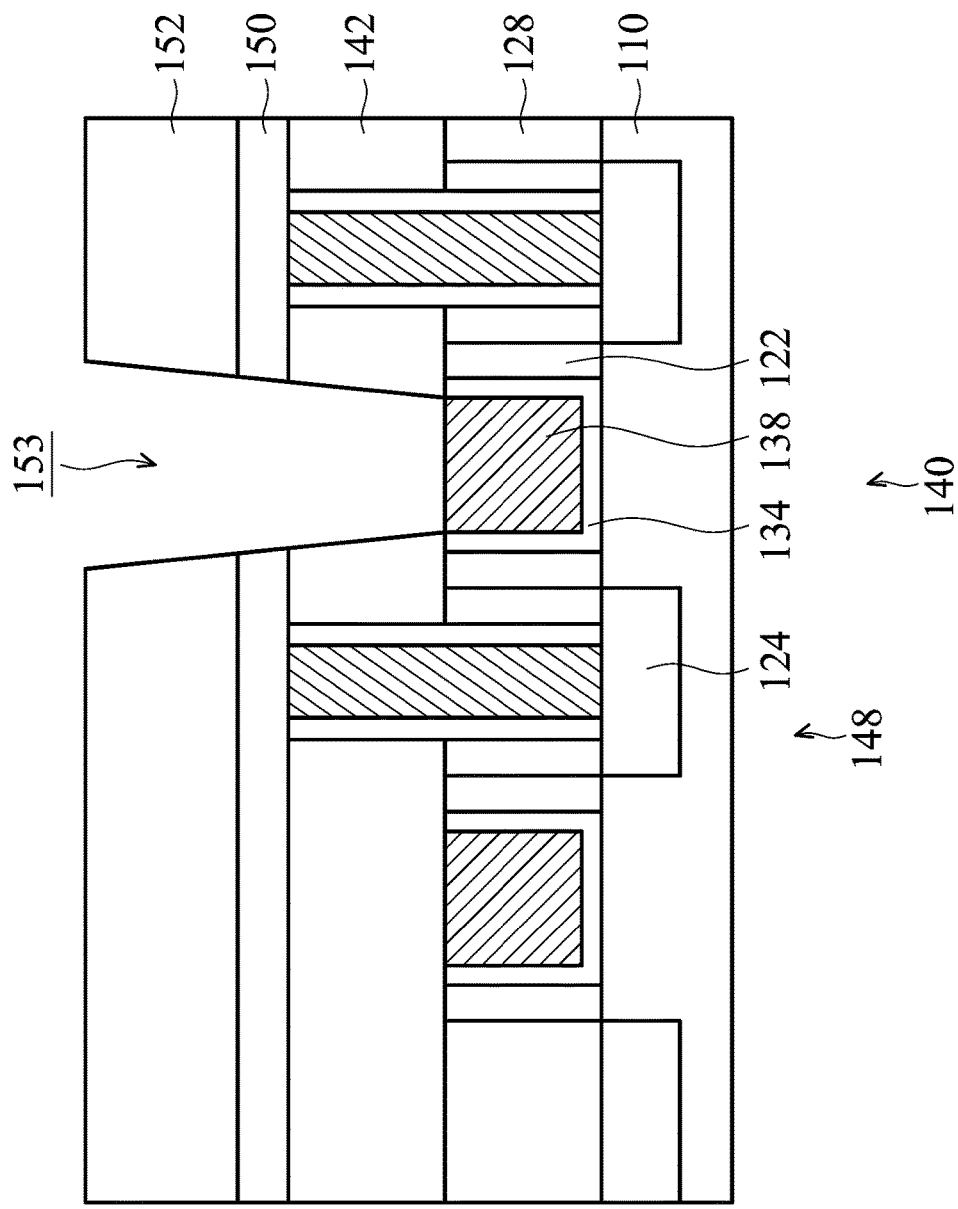
FIGS. 7A-7G show perspective representations of various stages of forming a FinFET device structure, in accordance with some embodiments of the disclosure.

As shown in FIG. 7A, the first hole 153 is formed on the gate structure 140. The top surface of the gate electrode layer 138 is exposed by the first hole 153. The first hole 153 has a tapered width from top to bottom.

Figure 7B:
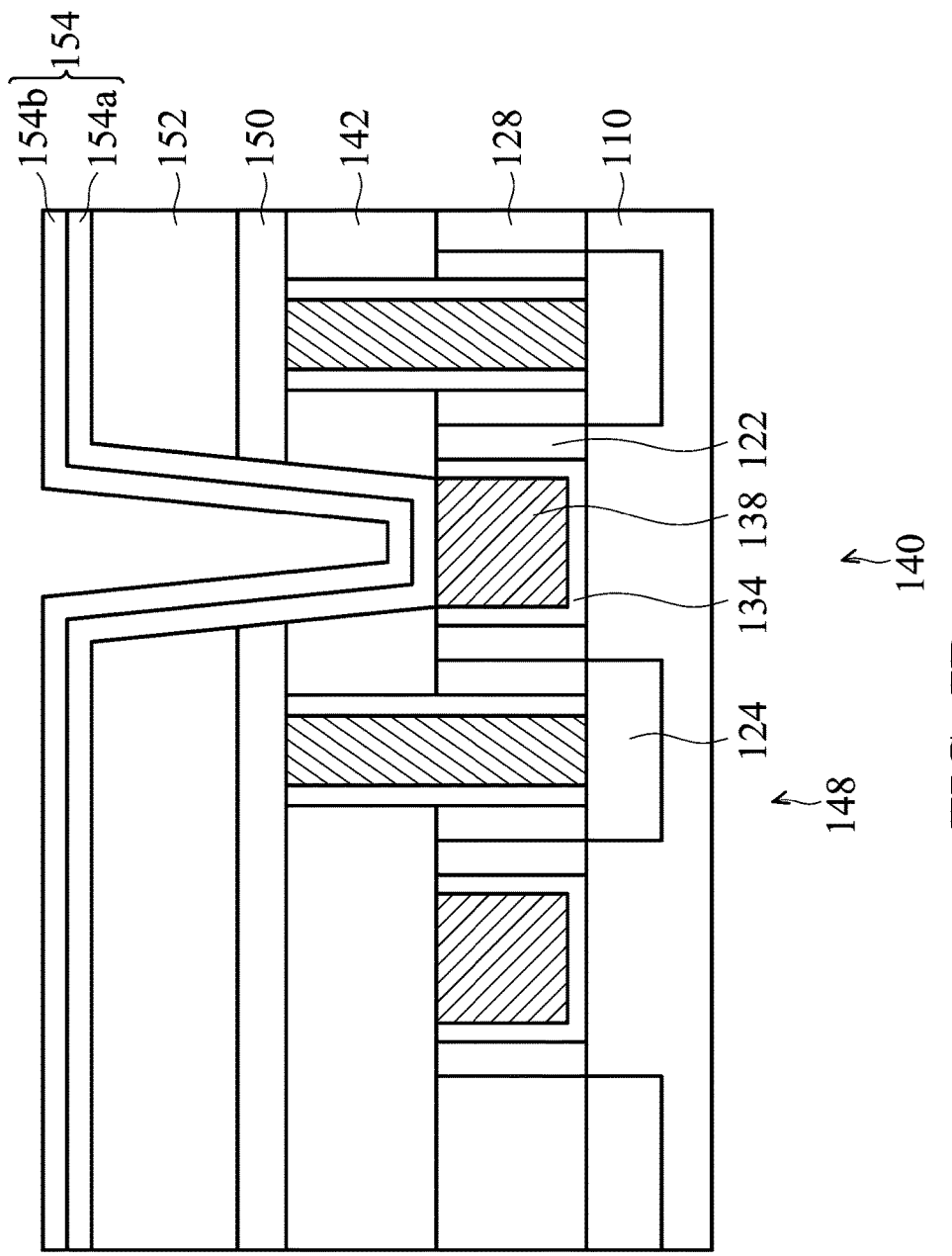

Afterwards, as shown in FIG. 7B, the first conductive layer 154 is formed on sidewall surfaces and the bottom surface of the first hole 153, in accordance with some embodiments of the disclosure. The first conductive layer 154 includes a first layer 154a and a second layer 154b formed on the first layer 154a. The first layer 154a and the second layer 154b are made of different materials. In some embodiments, the first layer 154a is made of titanium (Ti), and the second layer 154b is made of titanium nitride (TiN). The titanium (Ti) can capture the oxygen in the top surface of the gate electrode layer 138 to form titanium oxide (TiOx) to reduce the contact resistance between the first layer 154a and the gate electrode layer 138.

Figure 7C:
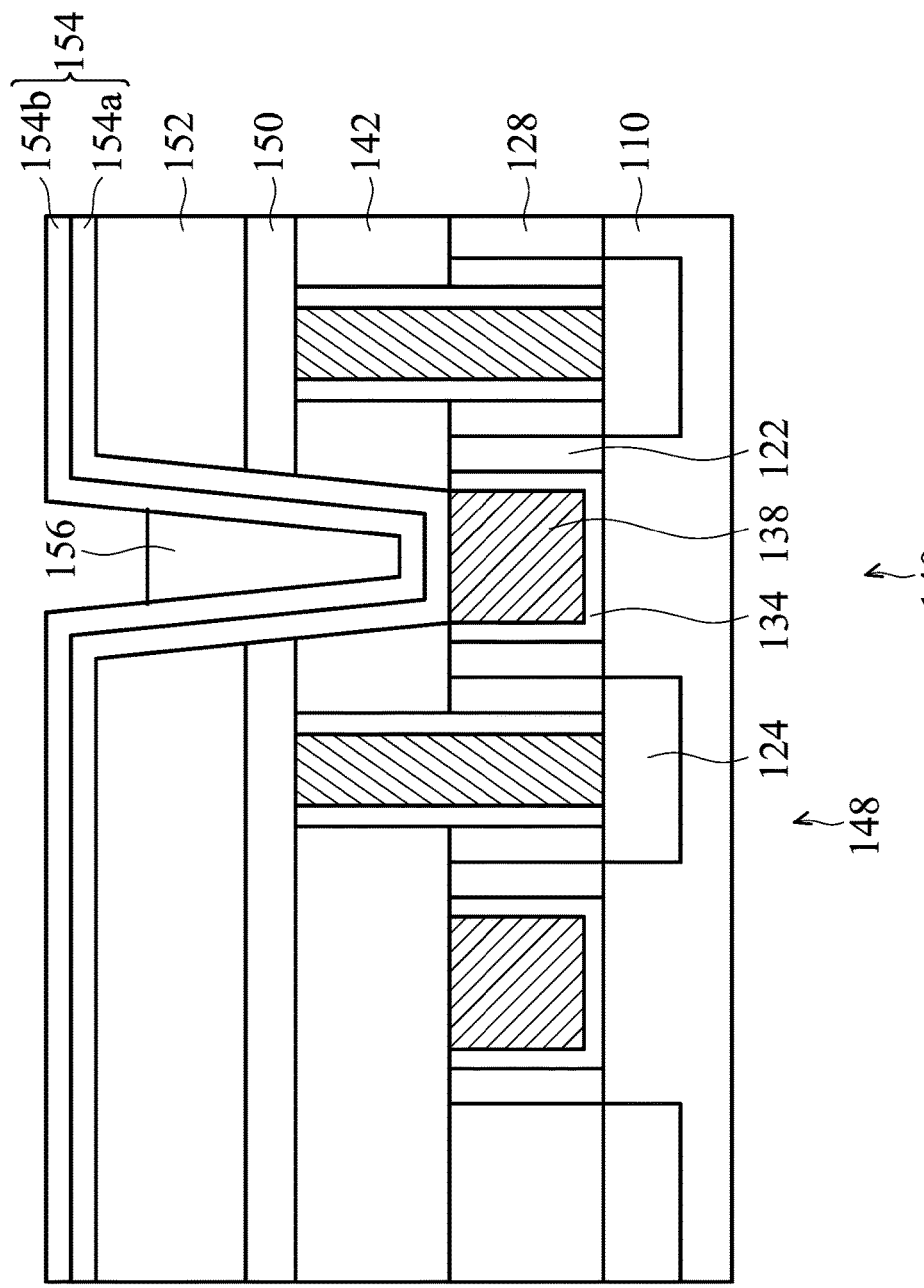

Next, as shown in FIG. 7C, the photoresist (PR) layer 156 is formed on the first conductive layer 154 and in a portion of the first hole 153, in accordance with some embodiments of the disclosure. The PR layer 156 is used as a protection layer to protect the first conductive layer 154 from being etched in the following process.

Figure 7D:
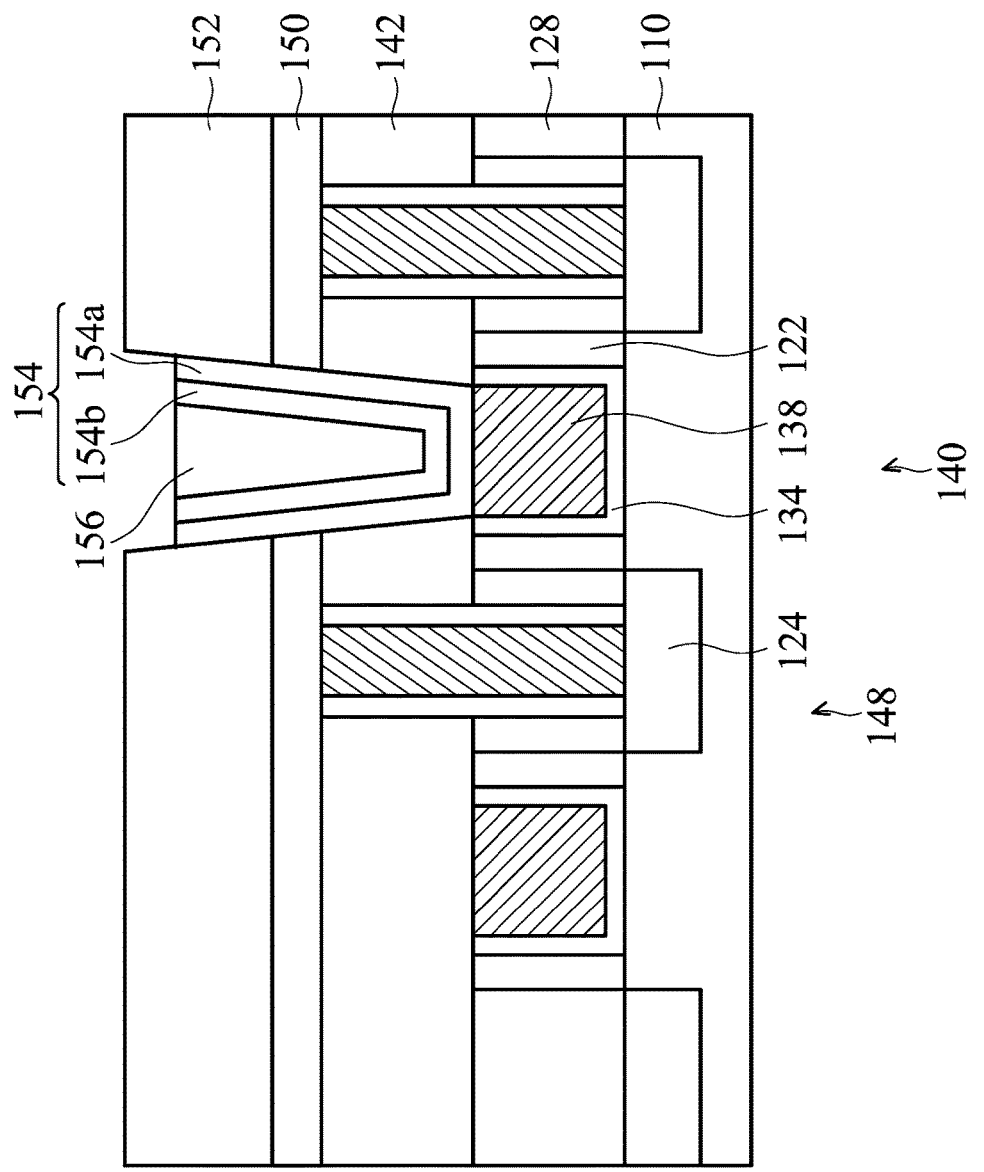

Subsequently, as shown in FIG. 7D, a portion of the first conductive layer 154 is removed, in accordance with some embodiments of the disclosure. The portion of the first conductive layer 154 above the second dielectric layer 152 is removed, but another portion which is protected by the PR layer 156 is not removed. More specifically, the first layer 154a and the second layer 154b each have a U-shaped structure, and the PR layer 156 is in the middle portion of the U-shaped structure.

Figure 7E:
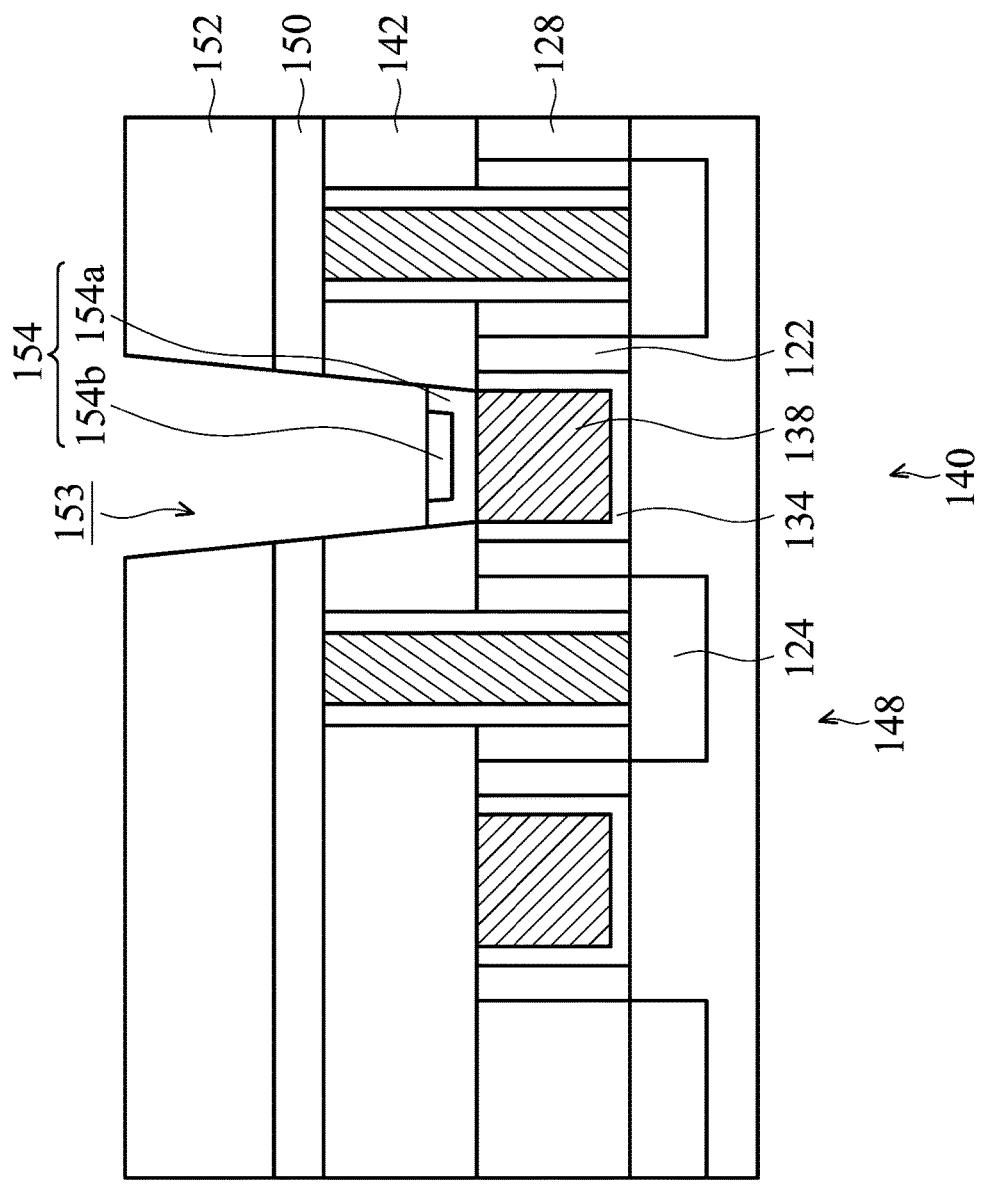

Afterwards, as shown in FIG. 7E, the PR layer 156 is removed, in accordance with some embodiments of the disclosure. As a result, the U-shaped conductive layer 154 is exposed. The second layer 154b is embedded in the first layer 154a. The second layer 154b is surrounded by the first layer 154a.

Figure 7F:
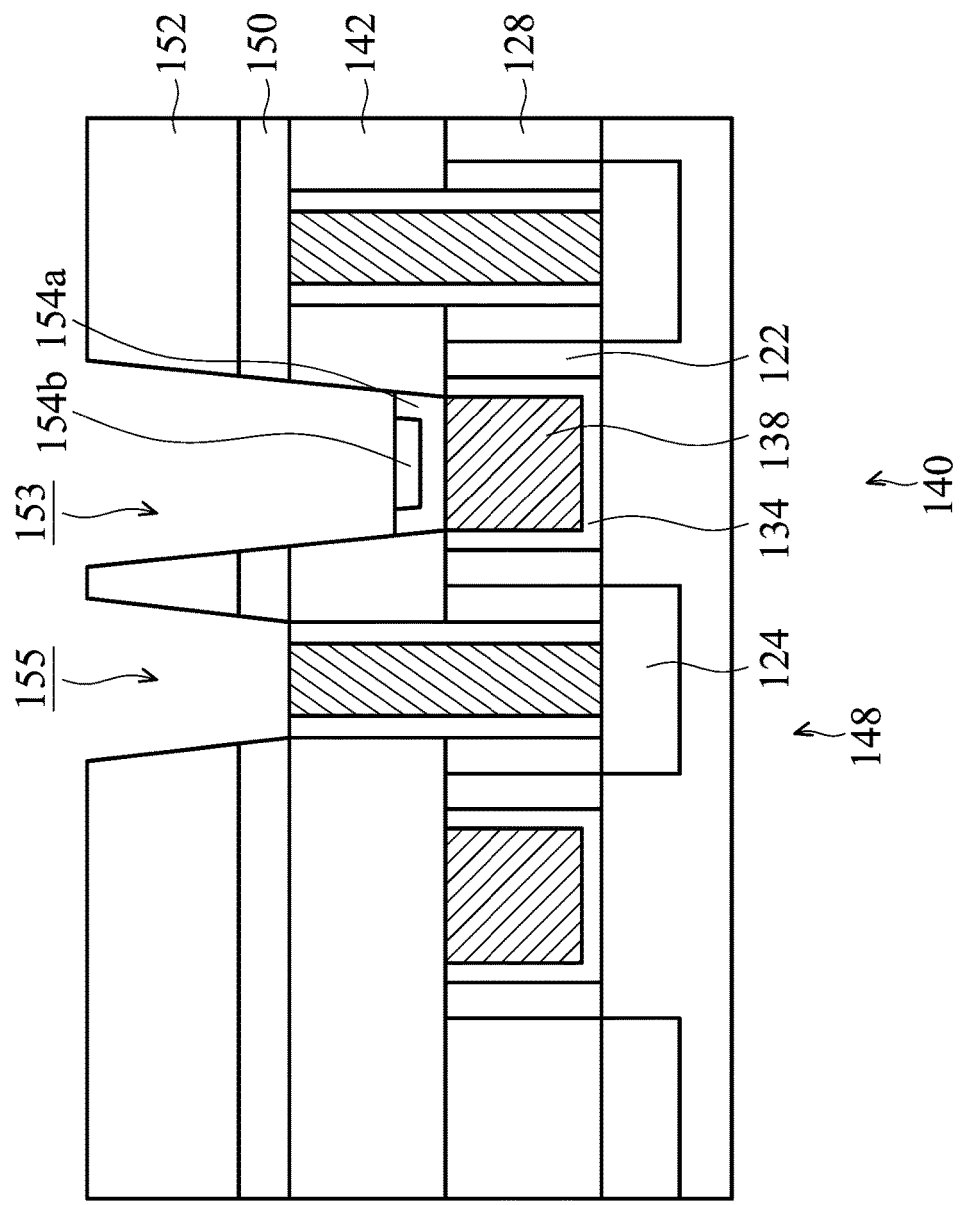

Subsequently, as shown in FIG. 7F, the second hole 155 is formed on the S/D contact structure 148, in accordance with some embodiments of the disclosure.

Figure 7G:
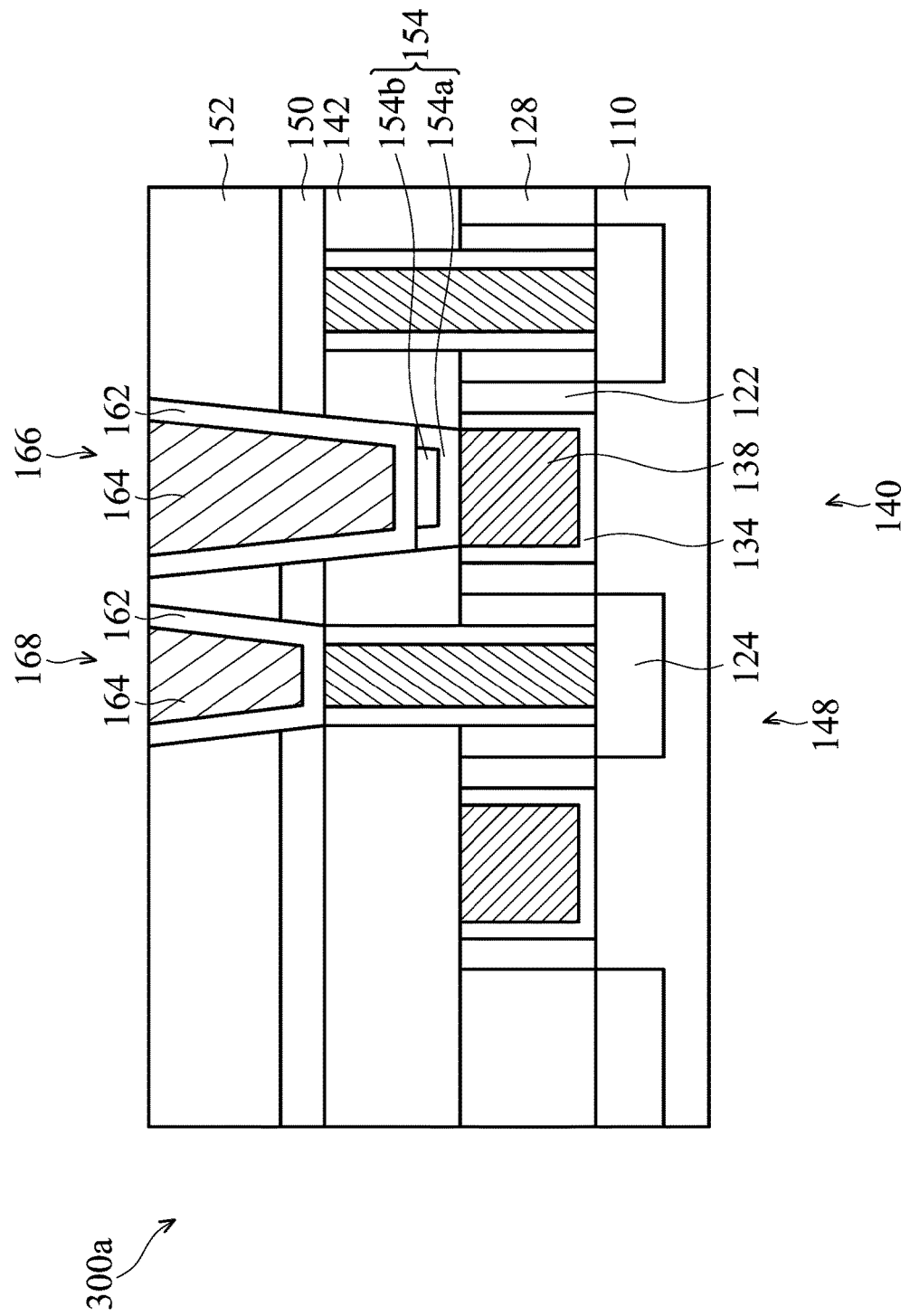
Figure 7G:
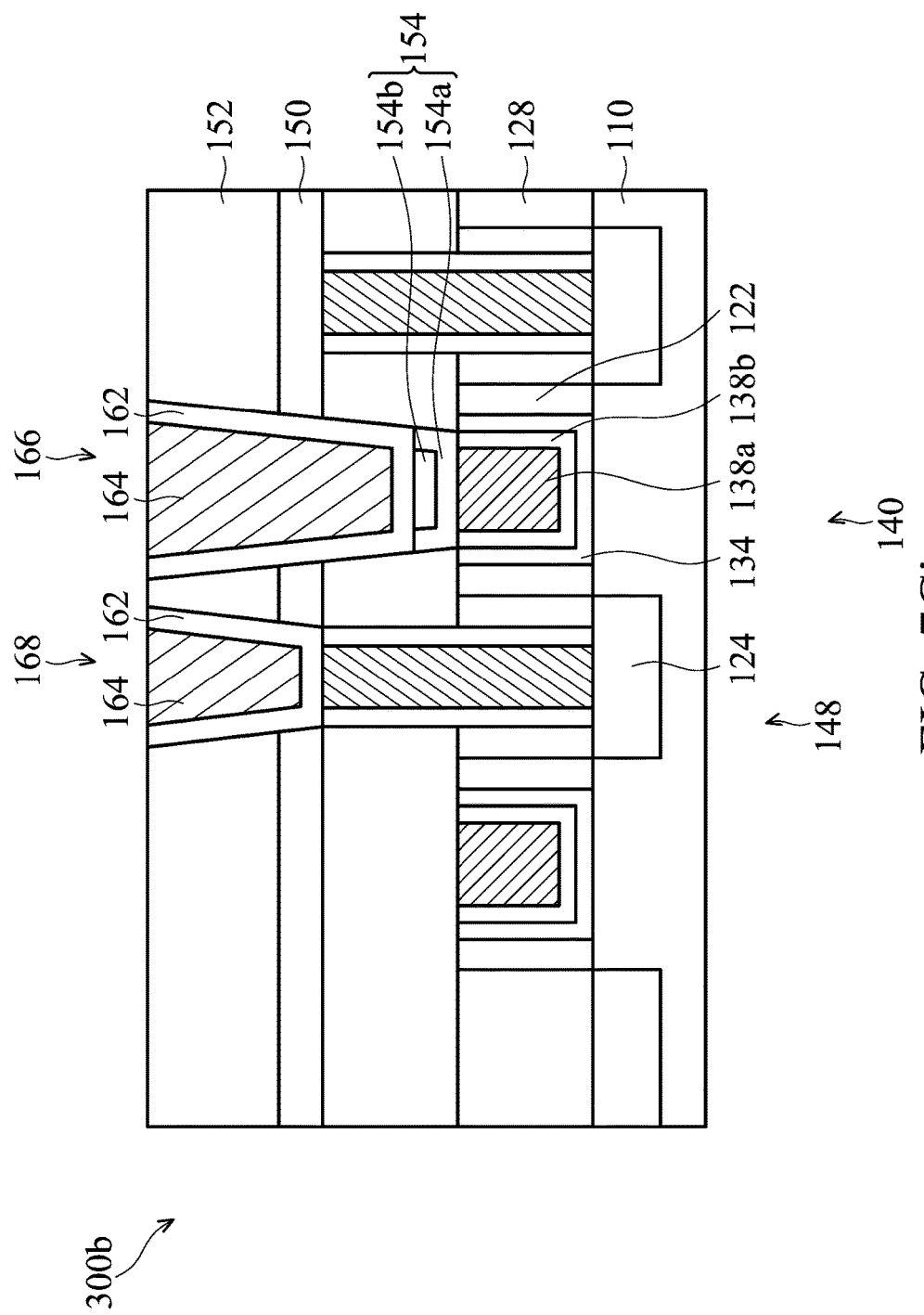

Next, as shown in FIG. 7G, the second conductive layer 164 is formed on the first conductive layer 154, and the S/D conductive plug 168 is formed on the S/D contact structure 148, in accordance with some embodiments of the disclosure.

FIG. 7G' shows a cross-sectional representation of a modified FinFET device structure 300b, in accordance with some embodiments of the disclosure. The FinFET device structure of FIG. 7G' is similar to the FinFET device structure of FIG. 7G, the difference between FIGS. 7G and 7G' is that the gate electrode layer 138 includes a first layer 138a and a second layer 138b. The first conductive layer 154 is formed on the first layer 138a and the second layer 138b.

Figure 8:
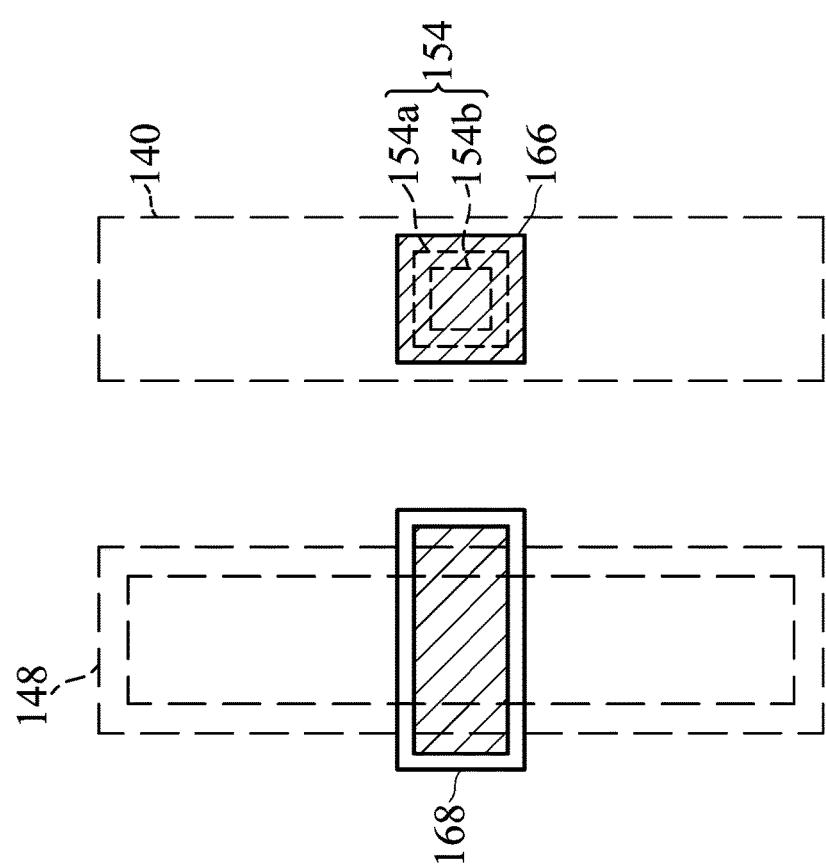
FIG. 8 shows a top-view of FinFET device structure, in accordance with some embodiments of the disclosure.

FIG. 8 shows a top-view of FinFET device structure 300a or 300b, in accordance with some embodiments of the disclosure. The first conductive layer 154 including the first layer 154a and the second layer 154b is between the gate structure 140 and the second conductive layer 164. The first layer 154a has a ring-shaped structure in a top-view, and the second layer 154b is surrounded by the first layer 154a.

In the first embodiments, the first conductive layer 154 is selectively formed on the gate electrode layer and/or the work function layer. A portion of the first conductive layer 154 is embedded in the gate structure 140. The bottom surface of the first conductive layer 154 is lower than the top surface of the gate dielectric layer 1534 and the top surface of the gate spacer layers 122. In some embodiments, the first conductive layer 154 has a protrusion portion penetrate into the gate electrode layer (or the work function layer).

In the second embodiment, the overall conductive layer 154 is over the gate structure 140. In the third embodiment, the first conductive layer 154 includes a U-shaped first layer and a second layer surrounding the first layer. The first conductive layer 154 is sandwiched between the gate electrode layer 138 and the second conductive layer to reduce the contact resistance.

Embodiments for forming a FinFET device structure and method for formation the same are provided. The FinFET device structure includes a gate structure formed over a fin structure, and a conductive layer over the gate structure. The gate structure includes a gate dielectric layer and a gate electrode layer (or the work function layer). The first conductive layer is formed over the gate electrode layer, but not formed on the gate dielectric layer. A second conductive layer is formed over the first conductive layer. A gate contact structure is constructed by the first conductive layer, a barrier layer and the second conductive layer. The contact resistance between the gate electrode layer of the gate structure and the second conductive layer is improved by the formation of the first conductive layer. Furthermore, the native oxide layer formed on the gate electrode layer is reduced or eliminated by the formation of the first conductive layer. In addition, the aspect ratio of the first hole for filling the second conductive layer is reduced due to the formation of the first conductive layer. Therefore, the performance of the FinFET device structure is reduced.

In some embodiments, a FinFET device structure is provided. The FinFET device structure includes a fin structure formed over a substrate and a gate dielectric layer formed over the fin structure. The FinFET device structure includes a gate electrode layer formed over the gate dielectric later and a gate contact structure formed over the gate electrode layer. The gate contact structure includes a first conductive layer formed over the gate electrode layer, a barrier layer formed over the first conductive layer and a second conductive layer over the barrier layer. The second conductive layer is electrically connected to the gate electrode layer by the first conductive layer.

In some embodiments, a FinFET device structure is provided. The FinFET device structure includes a fin structure formed over a substrate and a gate structure formed over the fin structure. The FinFET device structure also includes a first conductive layer formed over the gate structure and a second conductive layer formed over the first conductive layer. The FinFET device structure further includes a source/drain (S/D) structure formed over the fin structure and adjacent to the first gate structure and a source/drain (S/D) contact structure formed over the fin structure and adjacent to the gate structure. A top surface of the first conductive layer is higher than a bottom surface of the S/D contact structure and lower than a top surface of the S/D contact structure.

In some embodiments, a method for forming a FinFET device structure is provided. The method includes forming a fin structure over a substrate and forming a gate dielectric layer over the fin structure. The method also includes forming a gate electrode layer over the gate dielectric layer and forming a source/drain (S/D) structure adjacent to the gate electrode layer. The method includes forming an S/D contact structure over the S/D structure and forming a first conductive layer on the gate electrode layer. A bottom surface of the first conductive layer is lower than a top surface of the gate dielectric layer. The method further includes forming a second conductive layer over the first conductive layer, and the gate electrode layer is electrically connected to the second conductive layer by the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A fin field effect transistor (FinFET) device structure, comprising:
 a fin structure formed over a substrate;
 a gate dielectric layer formed over the fin structure;
 a gate electrode layer formed over the gate dielectric layer;

gate spacer layers formed over opposite sidewall surfaces of gate electrode layer and separated from the sidewall surfaces of gate electrode layer by the gate dielectric layer;
a first dielectric layer formed over the gate electrode layer; and
a gate contact structure formed over the gate electrode layer, wherein the gate contact structure comprises:
a first conductive layer formed over the gate electrode layer, comprising a first portion in the first dielectric layer and a second portion extending from the first portion and outside of the first dielectric layer, wherein the first portion of the first conductive layer protrudes from the gate spacer layers and the second portion of the first conductive layer is surrounded by the gate dielectric layer;
a barrier layer formed over the first conductive layer in the first dielectric layer; and
a second conductive layer over the barrier layer, wherein the second conductive layer is electrically connected to the gate electrode layer by the first conductive layer.

2. The fin field effect transistor (FinFET) device structure as claimed in claim 1, wherein the second portion of the first conductive layer is embedded in the gate electrode layer.

3. The fin field effect transistor (FinFET) device structure as claimed in claim 1, further comprising:
a source/drain (S/D) structure formed over the fin structure and adjacent to the gate electrode layer; and
a source/drain (S/D) contact structure formed over the S/D structure, wherein the source/drain (S/D) contact structure is electrically connected to the S/D structure, and a top surface of the S/D contact structure is higher than a top surface of the first conductive layer.

4. The fin field effect transistor (FinFET) device structure as claimed in claim 3, further comprising:
an S/D conductive plug formed over the S/D contact structure, wherein a top surface of the second conductive layer is level with a top surface of the S/D conductive plug.

5. The fin field effect transistor (FinFET) device structure as claimed claim 3, further comprising:
an isolation structure formed over the substrate, wherein the gate electrode layer and the S/D contact structure are formed on the isolation structure.

6. The fin field effect transistor (FinFET) device structure as claimed in claim 1, wherein a grain size of the second conductive layer is greater than a grain size of the first conductive layer.

7. The fin field effect transistor (FinFET) device structure as claimed in claim 1, wherein the second portion of the first conductive layer comprises an embedded portion which is below a top surface of the gate dielectric layer, and the embedded portion has a protrusion portion extending away from the top surface of the gate dielectric layer.

8. The fin field effect transistor (FinFET) device structure as claimed in claim 1, further comprising:
an etching stop layer formed over the first dielectric layer; and
a second dielectric layer formed over the etching stop layer, wherein the second conductive layer is through the etching stop layer and the second dielectric layer.

9. The fin field effect transistor (FinFET) device structure as claimed in claim 1, wherein the gate electrode layer comprises a first layer and a second layer surrounding the first layer, and the first conductive layer comprises a protrusion portion which is extended into the first layer.

10. A fin field effect transistor (FinFET) device structure, comprising:
a fin structure formed over a substrate;
a gate dielectric layer formed over the fin structure;
a gate electrode layer formed over the gate dielectric layer;
a dielectric layer formed over the gate electrode layer;
a first conductive layer formed over the gate electrode layer and in the dielectric layer, wherein the first conductive layer comprises:
a first layer electrically connected to the gate electrode layer; and
a second layer embedded in the first layer;
a barrier layer formed over the first conductive layer and in the dielectric layer, wherein a first interface between the barrier layer and the dielectric layer is aligned with a second interface between the first layer and the dielectric layer, and wherein the first interface and the second interface extend along the same direction; and
a second conductive layer over the barrier layer, wherein the second conductive layer is electrically connected to the first conductive layer.

11. The fin field effect transistor (FinFET) device structure as claimed in claim 10, further comprising:
a source/drain (S/D) structure formed over the fin structure and adjacent to the gate electrode layer; and
a source/drain (S/D) contact structure formed over the S/D structure, wherein the source/drain (S/D) contact structure is electrically connected to the S/D structure, and a top surface of the S/D contact structure is higher than a top surface of the first conductive layer.

12. The fin field effect transistor (FinFET) device structure as claimed in claim 10, wherein the gate electrode layer comprises a first layer and a second layer surrounding the first layer of the gate electrode layer.

13. The fin field effect transistor (FinFET) device structure as claimed in claim 10, wherein the first layer is U-shaped, and the second layer is surrounded by the first layer.

14. The fin field effect transistor (FinFET) device structure as claimed in claim 10, wherein the first conductive layer is not formed on a top surface of the gate dielectric layer.

15. A fin field effect transistor (FinFET) device structure, comprising:
a fin structure formed over a substrate;
a gate structure formed over the fin structure;
a first conductive layer formed over the gate structure;
a second conductive layer formed over the first conductive layer;
a barrier layer formed between the first conductive layer and the second conductive layer;
a source/drain (S/D) structure formed over the fin structure and adjacent to the gate structure;
a source/drain (S/D) contact structure formed over the source/drain (S/D) structure and adjacent to the gate structure, wherein a top surface of the source/drain (S/D) contact structure is higher than a bottom surface of the barrier layer and lower than a top surface of the barrier layer; and
a dielectric layer formed over the gate structure and surrounding the first conductive layer, the barrier layer, and the source/drain (S/D) contact structure.

16. The fin field effect transistor (FinFET) device structure as claimed in claim 15, wherein the first conductive layer comprises:

a first layer formed over the gate structure, wherein the first layer has a U-shaped structure; and a second layer formed in the first layer, wherein the second layer is embedded in the first layer.

17. The fin field effect transistor (FinFET) device structure as claimed in claim 15, wherein the gate structure has a first width, the first conductive layer has a second width, a top surface of the second conductive layer has a third width, and the first width is greater than the second width and the third width is greater than the second width.

18. The fin field effect transistor (FinFET) device structure as claimed in claim 15, further comprising:

an S/D conductive plug formed over the S/D contact structure, wherein a top surface of the second conductive layer is level with a top surface of the S/D conductive plug.

19. The fin field effect transistor (FinFET) device structure as claimed in claim 15, wherein a first interface is between the first conductive layer and the gate structure and a second interface is between the first conductive layer and the barrier layer.

20. The fin field effect transistor (FinFET) device structure as claimed in claim 15, wherein the gate structure comprises:

a gate dielectric layer formed on the fin structure; and a gate electrode layer formed on the gate dielectric layer, wherein the first conductive layer is in direct contact with the gate electrode layer.

* * * * *